United States Patent
Huang et al.

(10) Patent No.: US 11,411,114 B2
(45) Date of Patent: Aug. 9, 2022

(54) SEMICONDUCTOR STRUCTURE WITH ISOLATING FEATURE AND METHOD FOR FORMING THE SAME

(71) Applicant: Taiwan Semiconductor Manufacturing Company, Ltd., Hsinchu (TW)

(72) Inventors: Yu-Xuan Huang, Hsinchu (TW); Ching-Wei Tsai, Hsinchu (TW); Hou-Yu Chen, Hsinchu County (TW); Kuan-Lun Cheng, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/082,711

(22) Filed: Oct. 28, 2020

(65) Prior Publication Data

US 2021/0202742 A1    Jul. 1, 2021

Related U.S. Application Data

(60) Provisional application No. 62/953,715, filed on Dec. 26, 2019.

(51) Int. Cl.
| H01L 29/78 | (2006.01) |
| H01L 29/66 | (2006.01) |
| H01L 29/06 | (2006.01) |
| H01L 21/8234 | (2006.01) |

(52) U.S. Cl.
CPC .. *H01L 29/7851* (2013.01); *H01L 21/823412* (2013.01); *H01L 21/823418* (2013.01); *H01L 21/823431* (2013.01); *H01L 29/0669* (2013.01); *H01L 29/66795* (2013.01)

(58) Field of Classification Search
CPC ............. H01L 29/7851; H01L 29/0669; H01L 29/0673; H01L 29/42392; H01L 2029/7858
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

FOREIGN PATENT DOCUMENTS

TW    201901960 A    1/2019

OTHER PUBLICATIONS

Taiwanese Office Action and Seach Report for Taiwanese Application No. 109145948, dated Nov. 10, 2021.

*Primary Examiner* — Changhyun Yi
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and a fin structure protruding from the substrate. The semiconductor structure also includes nanostructures formed over the fin structure and a gate structure surrounding the nanostructures. The semiconductor structure also includes a source/drain structure connected to the nanostructures and an isolating feature sandwiched between the fin structure and the source/drain structure.

20 Claims, 29 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,770,358 B2 | 9/2020 | Van Dal et al. |
| 2014/0061775 A1 | 3/2014 | Chuang et al. |
| 2014/0339611 A1 | 11/2014 | Leobandung |
| 2015/0162403 A1 | 6/2015 | Oxland |
| 2017/0005195 A1* | 1/2017 | Ching ............... H01L 29/42392 |
| 2018/0151683 A1* | 5/2018 | Yeo .................... H01L 29/0847 |
| 2019/0131180 A1 | 5/2019 | Van Dal et al. |
| 2020/0027794 A1 | 1/2020 | Van Dal et al. |
| 2020/0098757 A1* | 3/2020 | Rachmady ........ H01L 29/42392 |

* cited by examiner

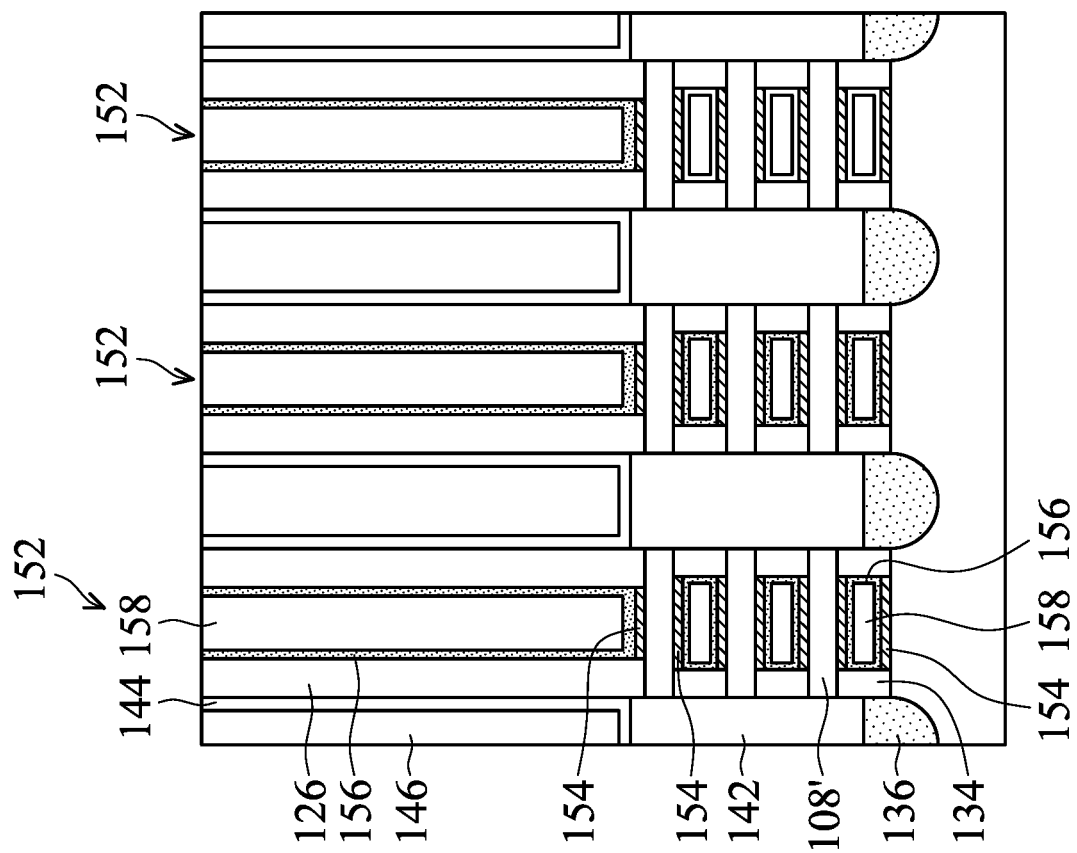
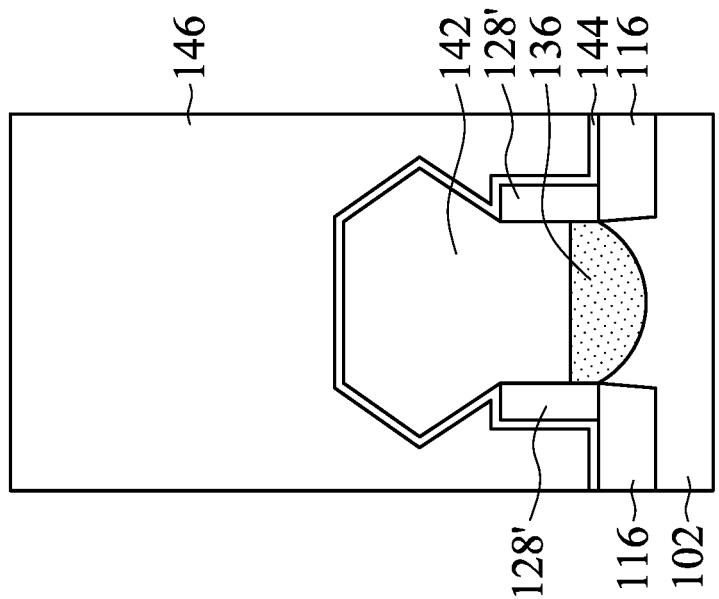
FIG. 2J-1
FIG. 2J-2

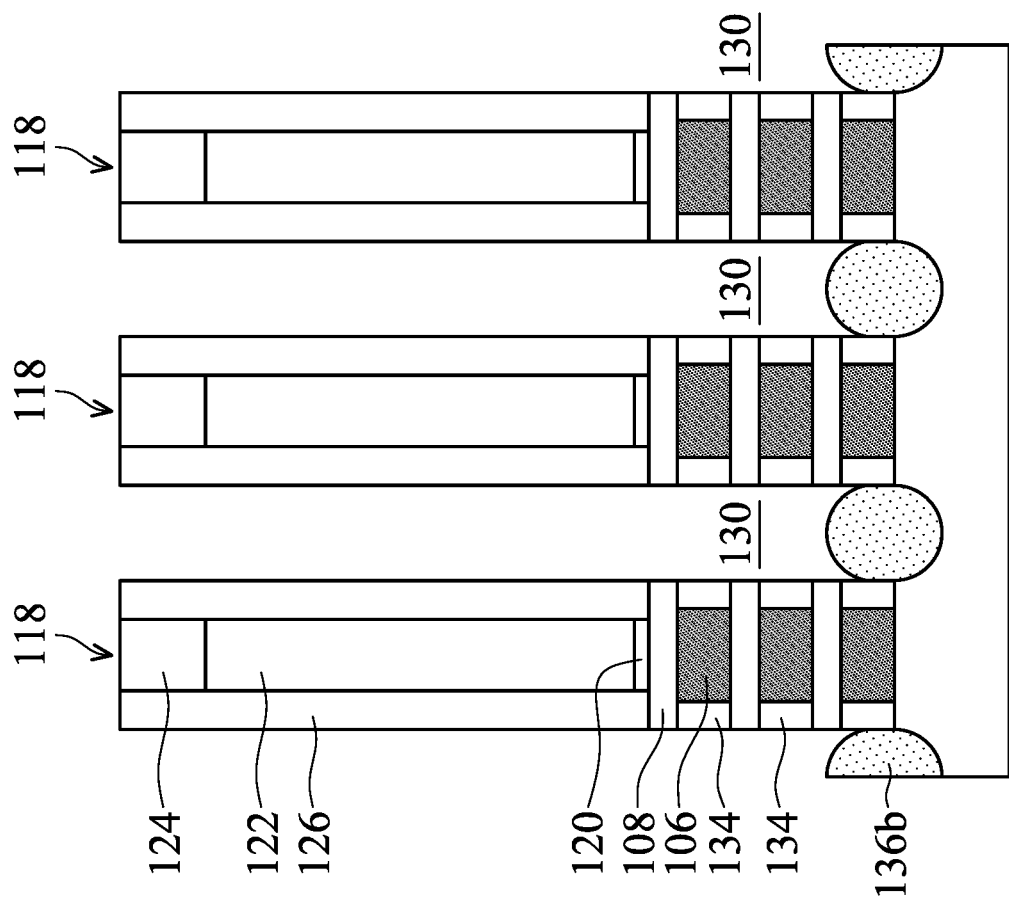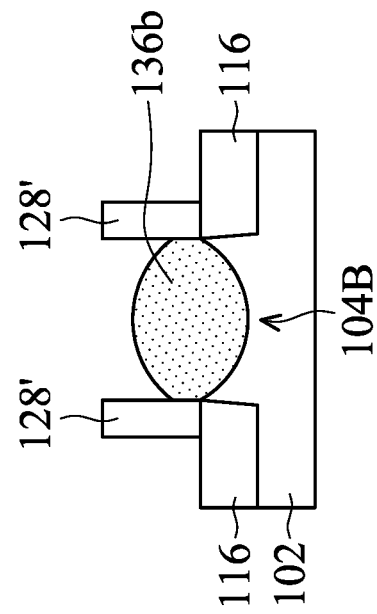

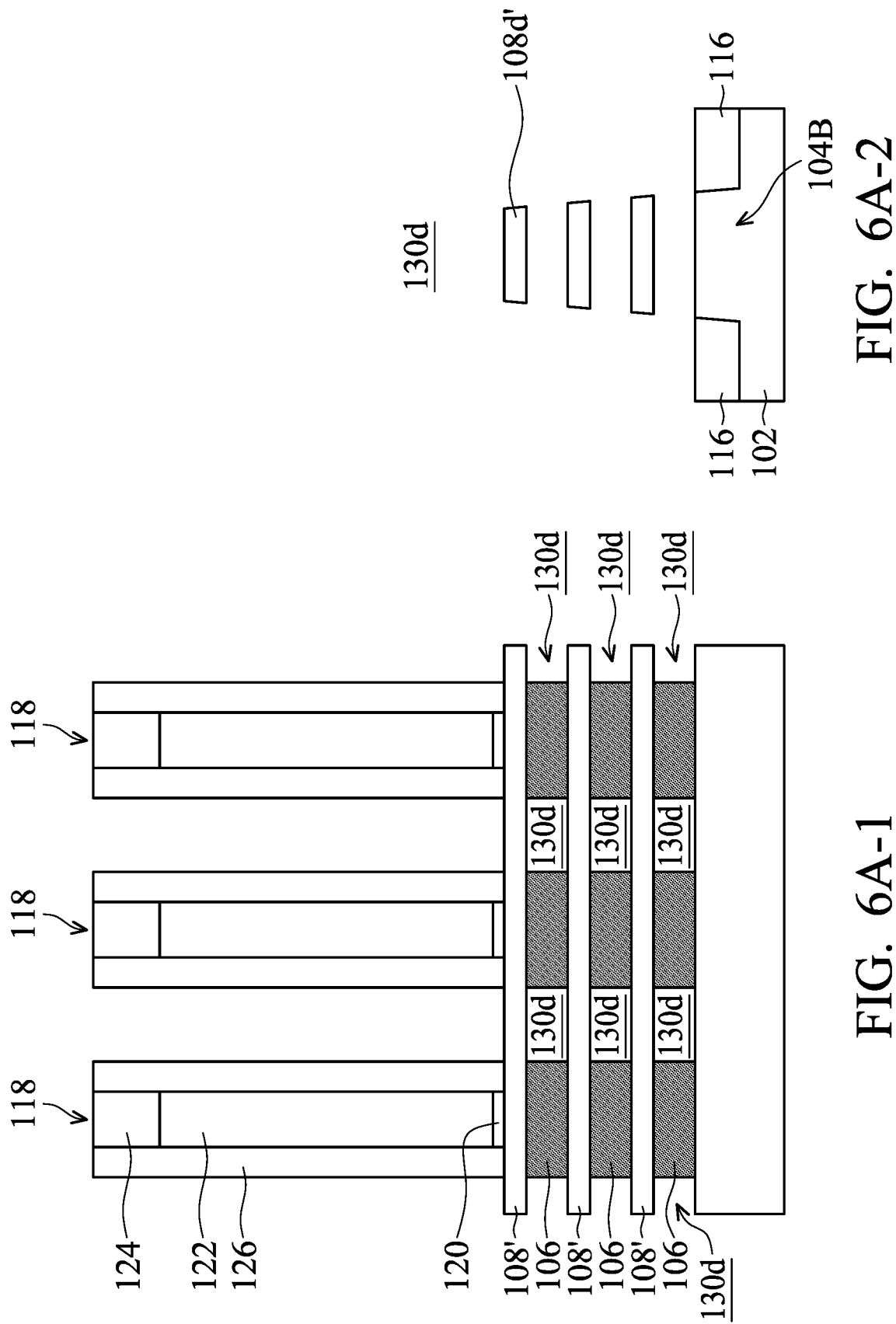

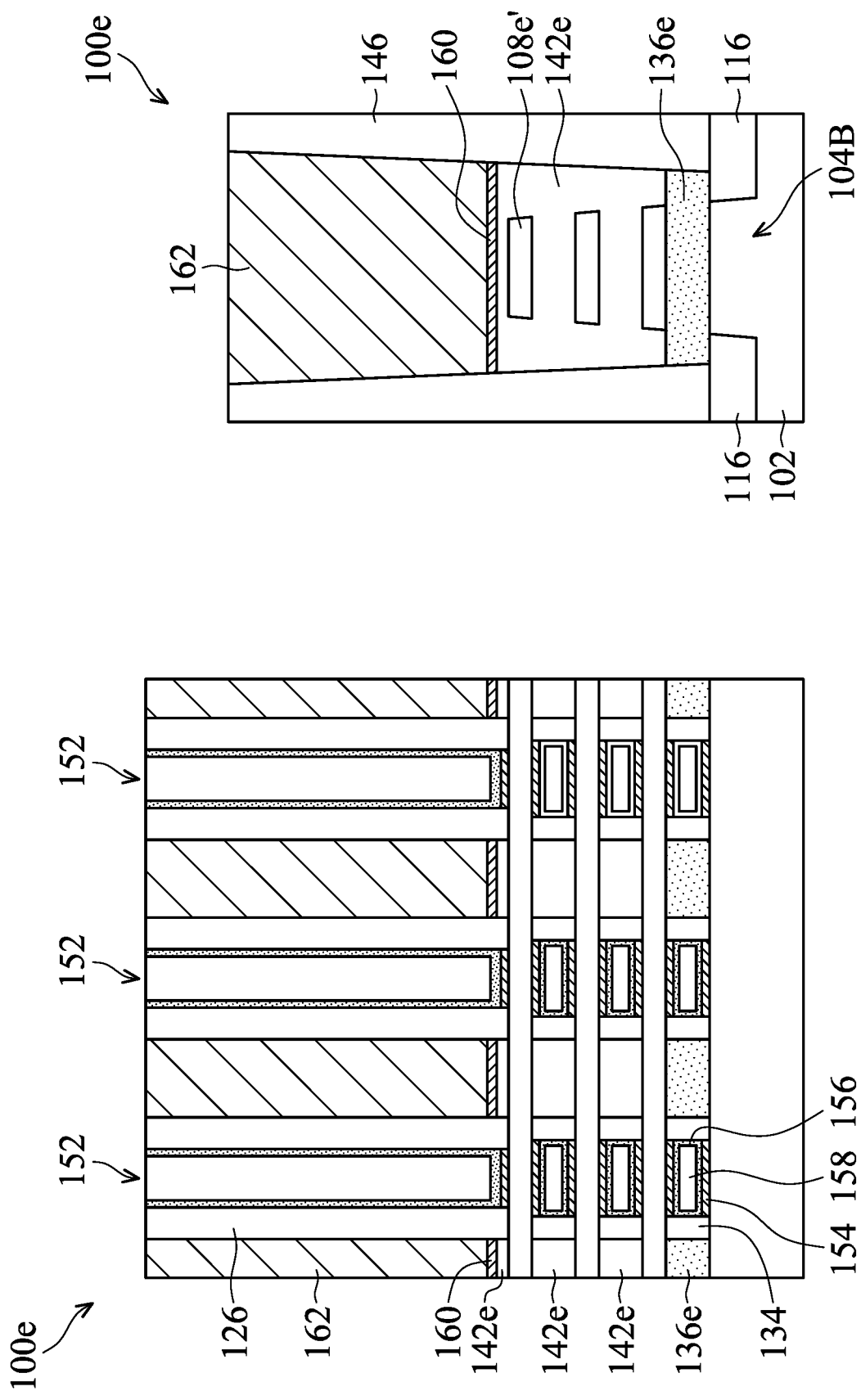

SEMICONDUCTOR STRUCTURE WITH ISOLATING FEATURE AND METHOD FOR FORMING THE SAME

PRIORITY CLAIM AND CROSS-REFERENCE

This application claims the benefit of U.S. Provisional Application No. 62/953,715, filed on Dec. 26, 2019, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. However, integration of fabrication of the GAA features can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2 to 2K-2 illustrate cross-sectional representations of various stages of manufacturing the semiconductor structure shown along line B-B' in FIG. 1E in accordance with some embodiments.

FIGS. 3A-1 and 3B-1 illustrate cross-sectional representations of various stages of manufacturing a semiconductor structure shown along line A-A' in FIG. 1E in accordance with some embodiments.

FIGS. 3A-2 and 3B-2 illustrate cross-sectional representations of various stages of manufacturing the semiconductor structure shown along line B-B' in FIG. 1E in accordance with some embodiments.

FIGS. 4A-1 to 4C-1 illustrate cross-sectional representations of various stages of manufacturing a semiconductor structure shown along line A-A' in FIG. 1E in accordance with some embodiments.

FIGS. 4A-2 and 4C-2 illustrate cross-sectional representations of various stages of manufacturing the semiconductor structure shown along line B-B' in FIG. 1E in accordance with some embodiments.

FIGS. 5A-1 and 5B-1 illustrate cross-sectional representations of various stages of manufacturing a semiconductor structure shown along line A-A' in FIG. 1E in accordance with some embodiments.

FIGS. 5A-2 and 5B-2 illustrate cross-sectional representations of various stages of manufacturing the semiconductor structure shown along line B-B' in FIG. 1E in accordance with some embodiments.

FIGS. 6A-1 and 6B-1 illustrate cross-sectional representations of various stages of manufacturing a semiconductor structure shown along line A-A' in FIG. 1E in accordance with some embodiments.

FIGS. 6A-2 and 6B-2 illustrate cross-sectional representations of various stages of manufacturing the semiconductor structure shown along line B-B' in FIG. 1E in accordance with some embodiments.

FIGS. 7A-1 and 7A-2 illustrate cross-sectional representations of a semiconductor structure in accordance with some embodiments.

DETAILED DESCRIPTION

Figure 1A:
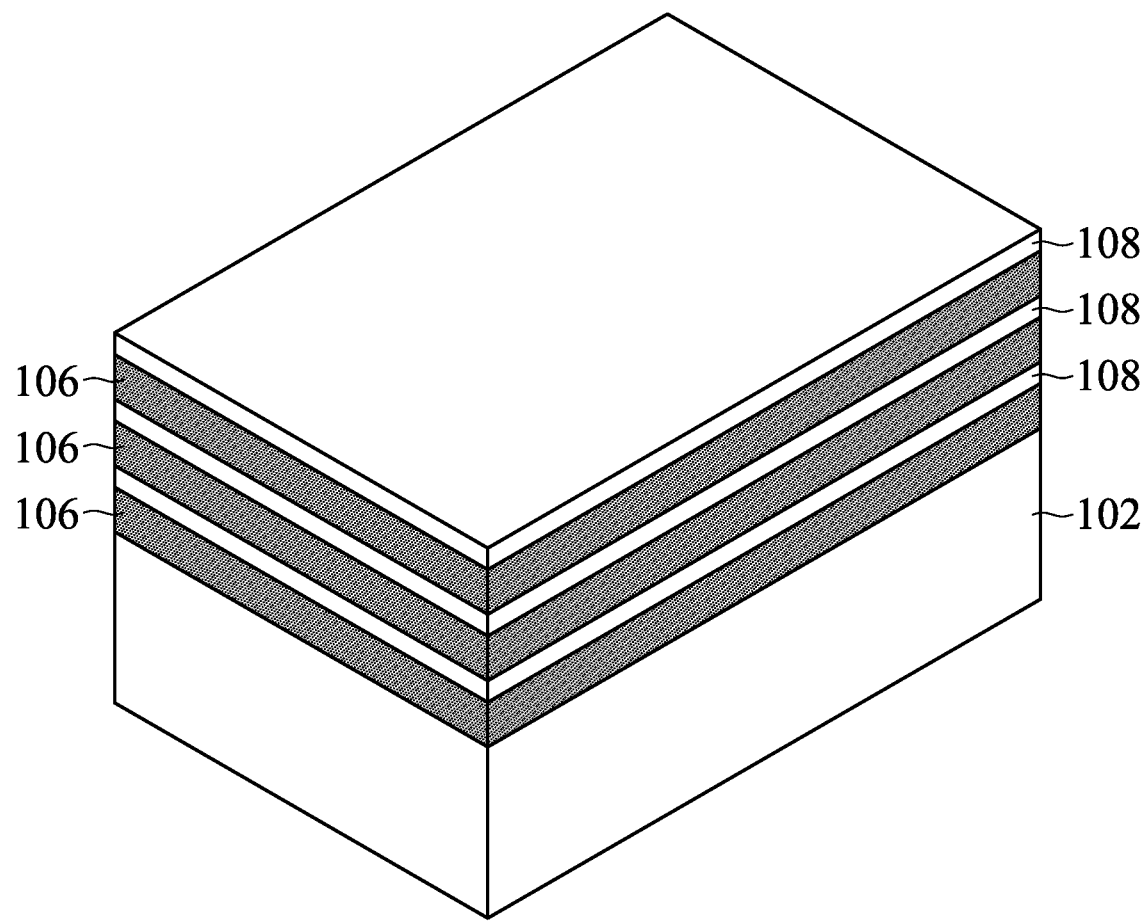
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of semiconductor structures and methods for forming the same are provided. The semiconductor structures may be gate-all-around (GAA) transistors. A gate-all-around transistor may include semiconductor nanostructures and source/drain structures formed on opposite sides of the nanostructures. However, as the device size scaling down, the source/drain structures may adversely result in an off-state leakage current path when directly connected to the substrate underneath. Accordingly, in some embodiments, an additional isolating feature is formed before forming the source/drain structures, so that the source/drain structures will be separated from the substrate by the isolating feature, and the current leakage may be avoided.

FIGS. 1A to 1E illustrate perspective views of intermediate stages of manufacturing a semiconductor structure 100 in accordance with some embodiments. As shown in FIG. 1A, first semiconductor material layers 106 and second semiconductor material layers 108 are formed over a substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or less numbers of the first semiconductor material layers 106 and the second semiconductor material layers 108. For example, the semiconductor structure may include two to five of the first semiconductor material layers 106 and the second semiconductor material layers 108 individually.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
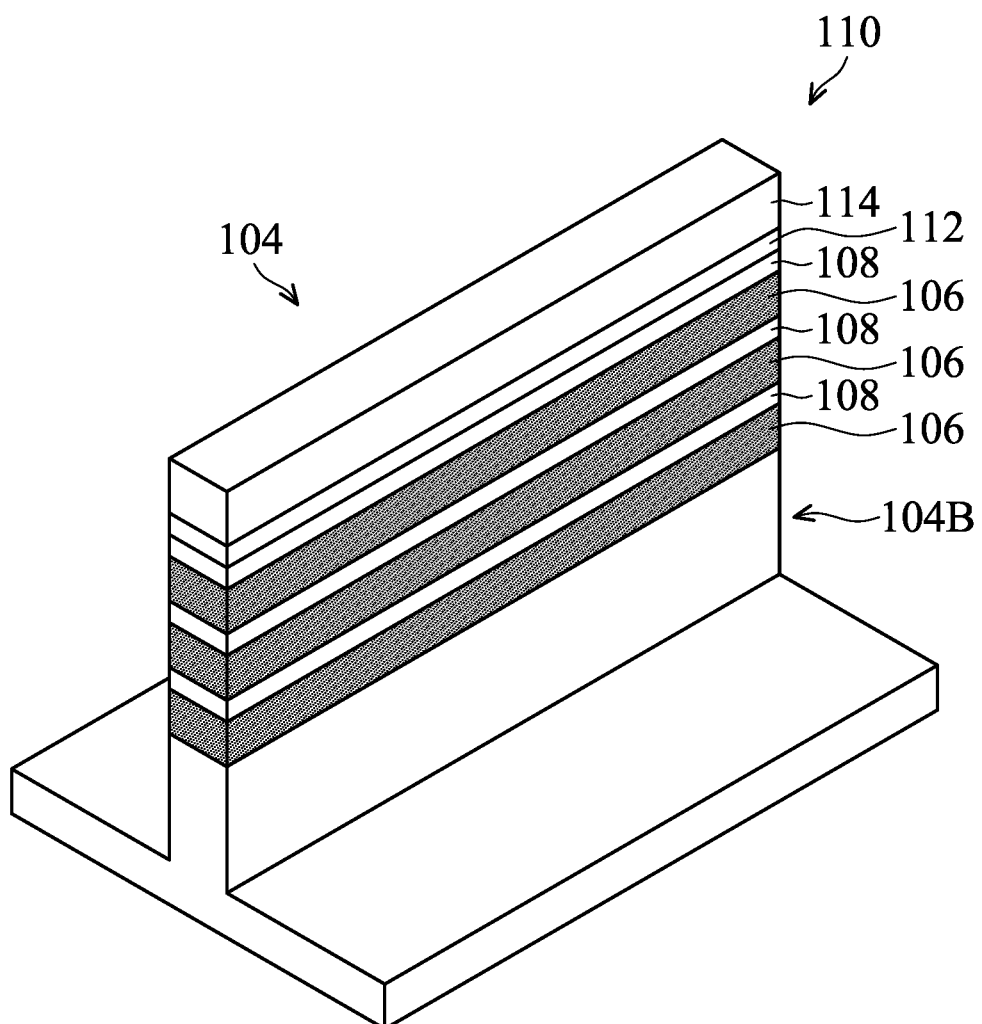

After the first semiconductor material layers 106 and the second semiconductor material layers 108 are formed as a semiconductor material stack over the substrate 102, the semiconductor material stack is patterned to form a fin structure 104, as shown in FIG. 1B in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or CVD, and the nitride layer 114 may be made of silicon nitride, which is formed by CVD, such as LPCVD or plasma-enhanced CVD (PECVD).

Figure 1C:
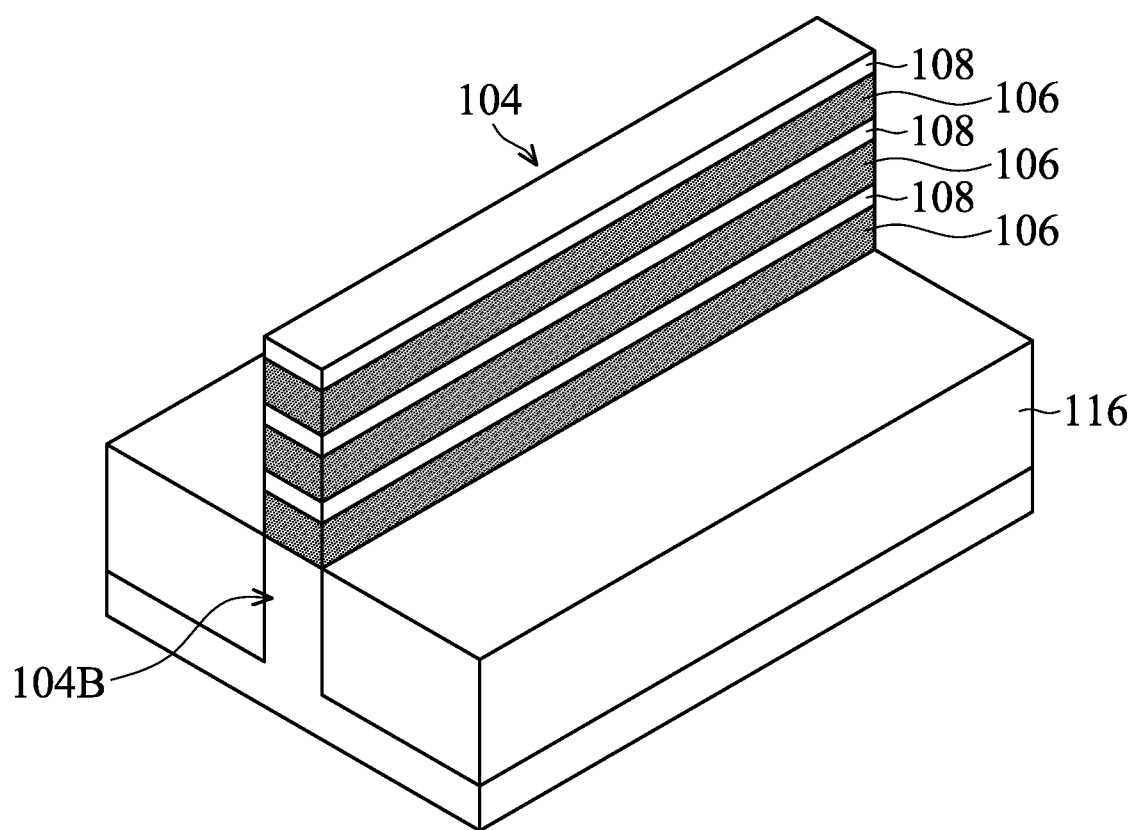

After the fin structure 104 is formed, an isolation structure 116 is formed around the fin structure 104, and the mask structure 110 is removed, as shown in FIG. 1C in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
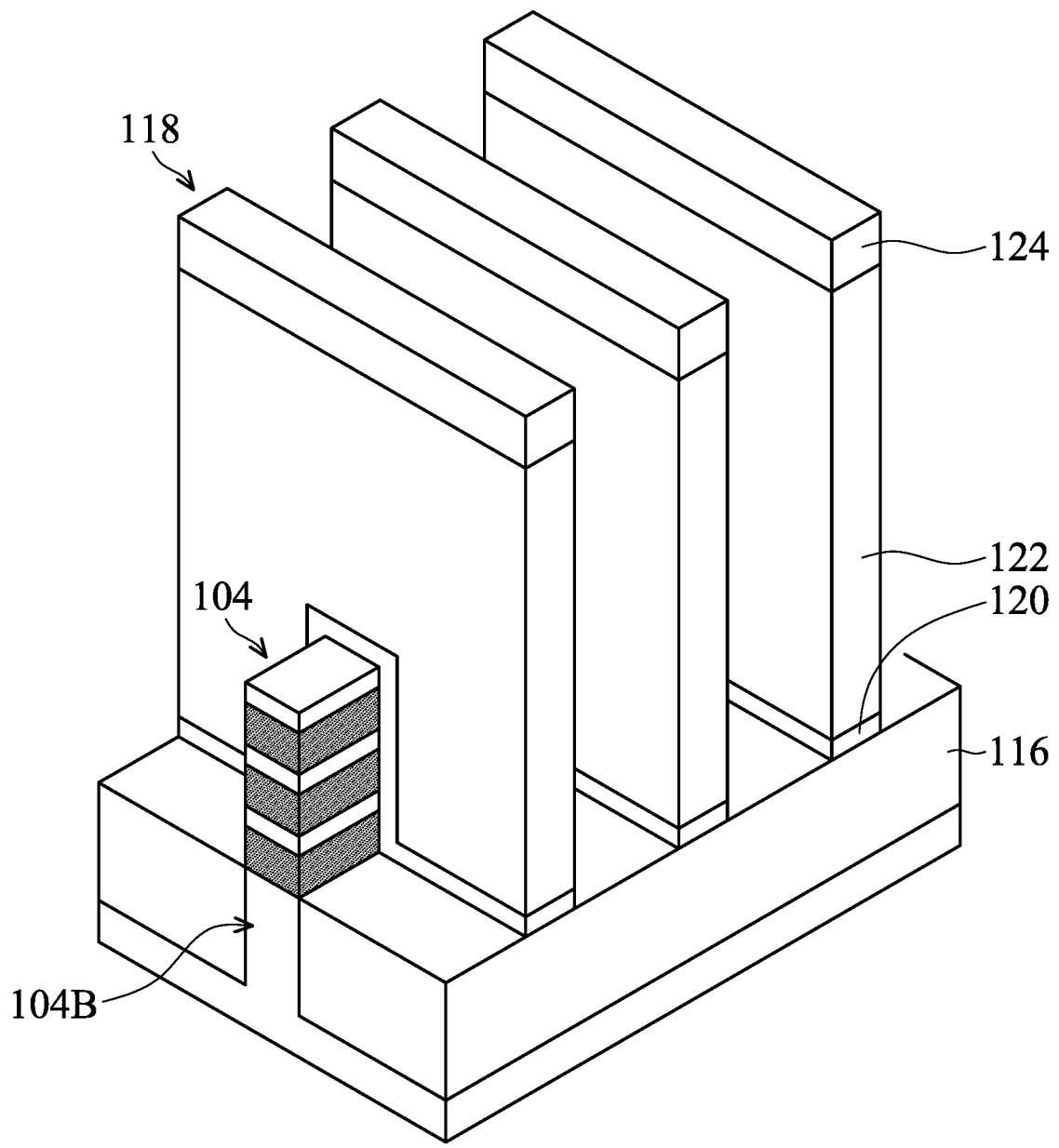

After the isolation structure 114 is formed, dummy gate structures 118 are formed across the fin structure 104 and extend over the isolation structure 116, as shown in FIG. 1D in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfSiO, HfAlO, or a combination thereof. In some embodiments, the dummy gate dielectric layers 120 are formed using thermal oxidation, CVD, ALD, physical vapor deposition (PVD), another suitable method, or a combination thereof.

In some embodiments, the dummy gate electrode layers 122 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using CVD, PVD, or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
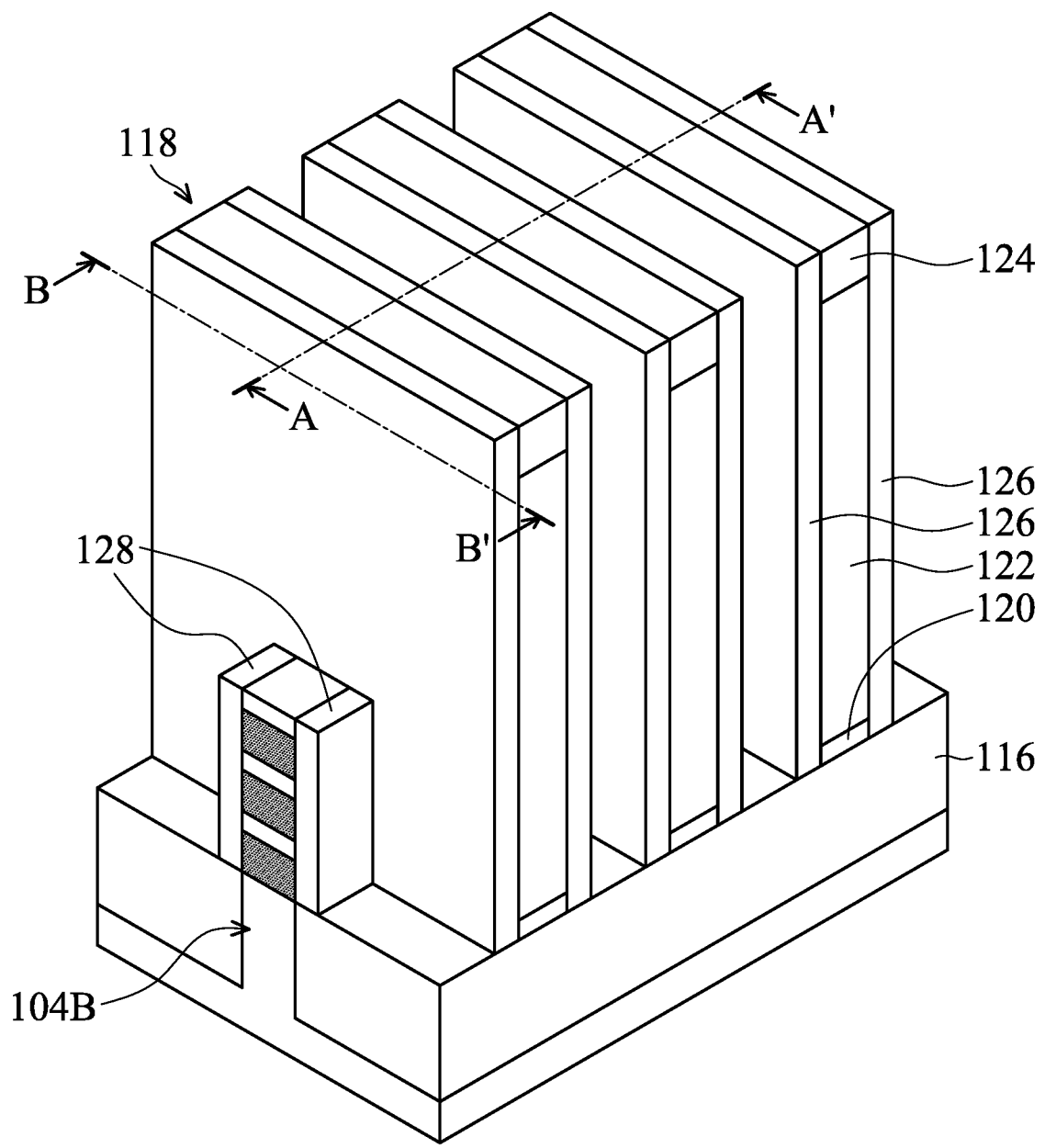

After the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, as shown in FIG. 1E in accordance with some embodiments.

The gate spacers 126 may be configured to offset subsequently formed source/drain features, separate source/drain features from the dummy gate structure 118, and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figures 2, 2A:
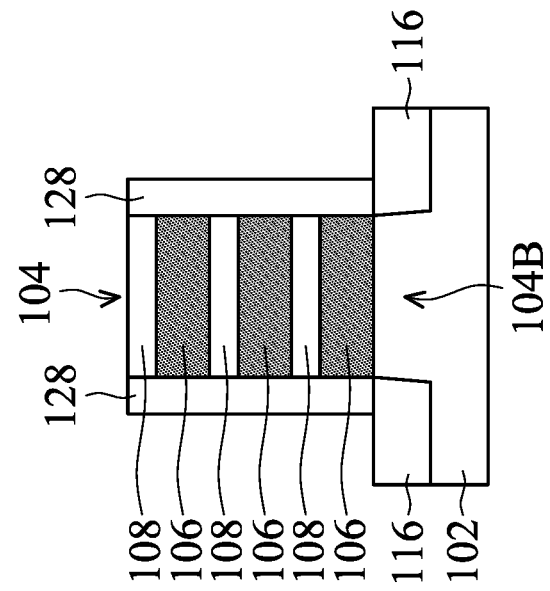
Figures 1, 2A:
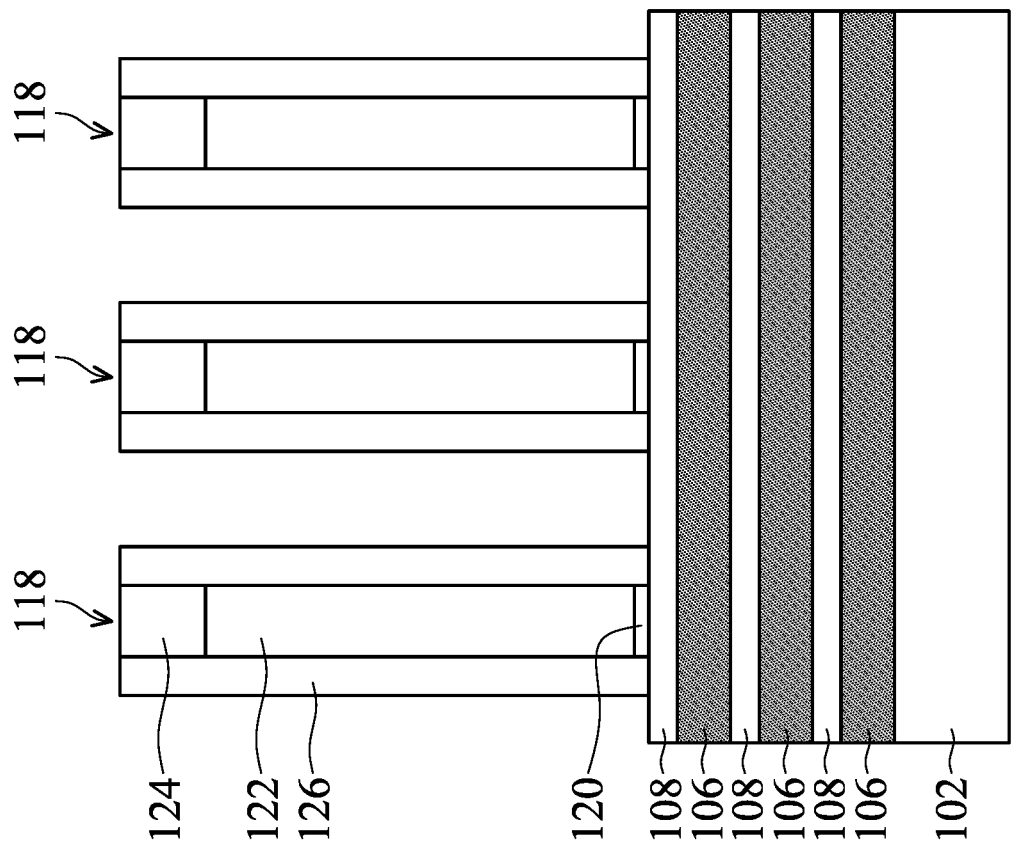
FIGS. 2A-1 to 2K-1 illustrate cross-sectional representations of various stages of manufacturing the semiconductor structure shown along line A-A' in FIG. 1E in accordance with some embodiments.
Figures 2, 2B:
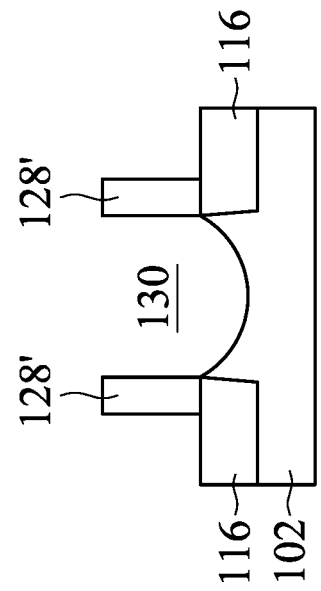
Figures 1, 2B:
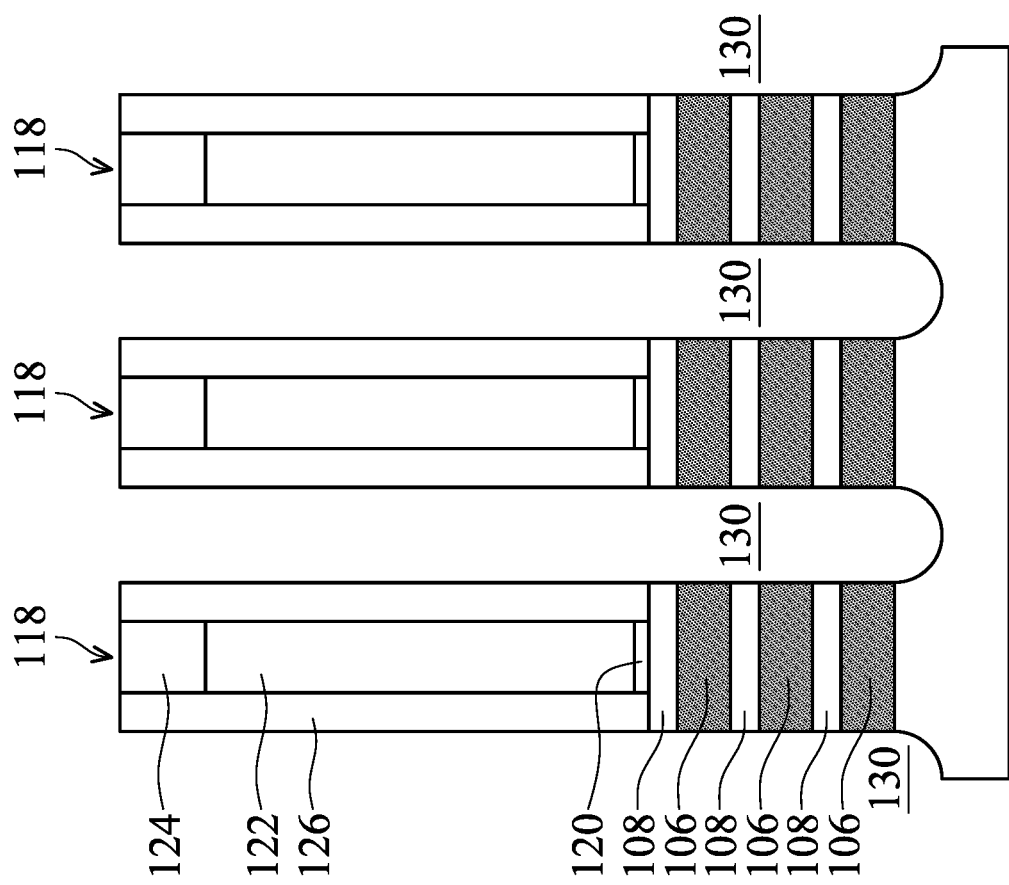
Figures 1, 2C:
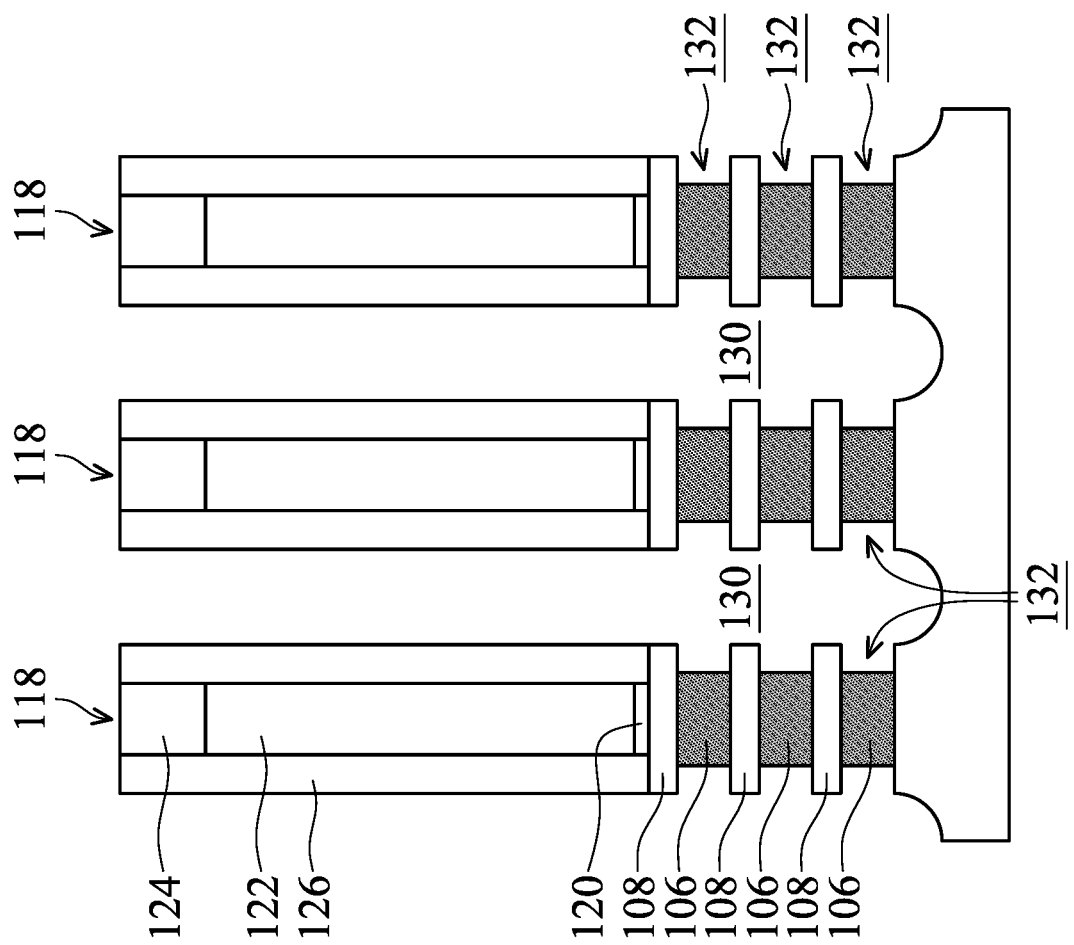
Figures 2, 2C:
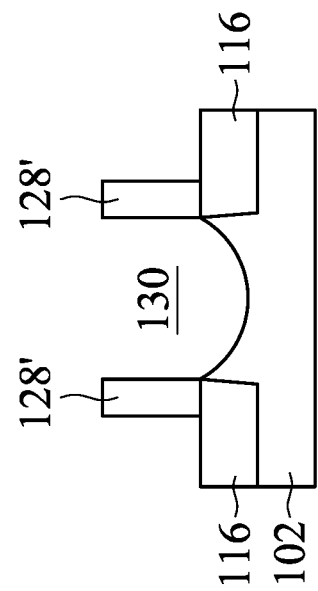
Figures 2, 2D:
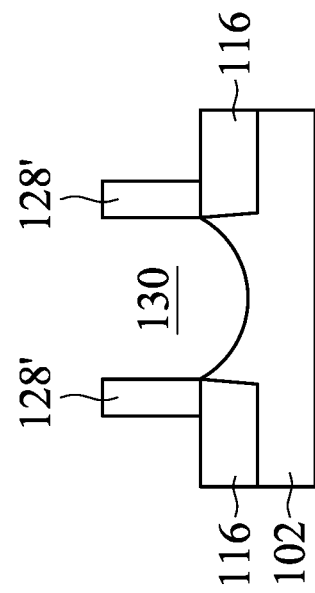
Figures 1, 2D:
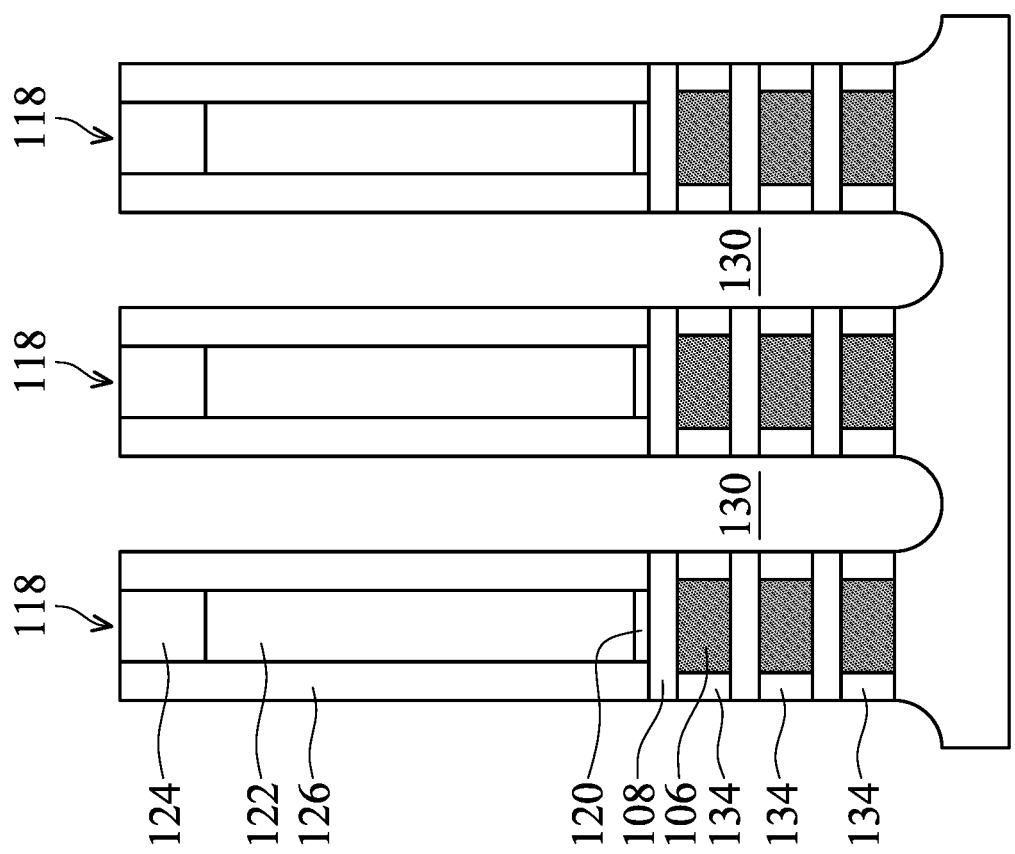
Figures 2, 2E:
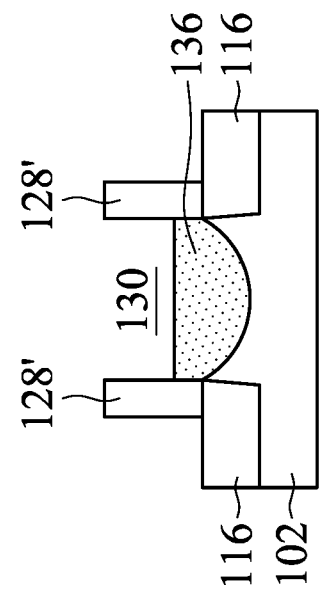
Figures 1, 2E:
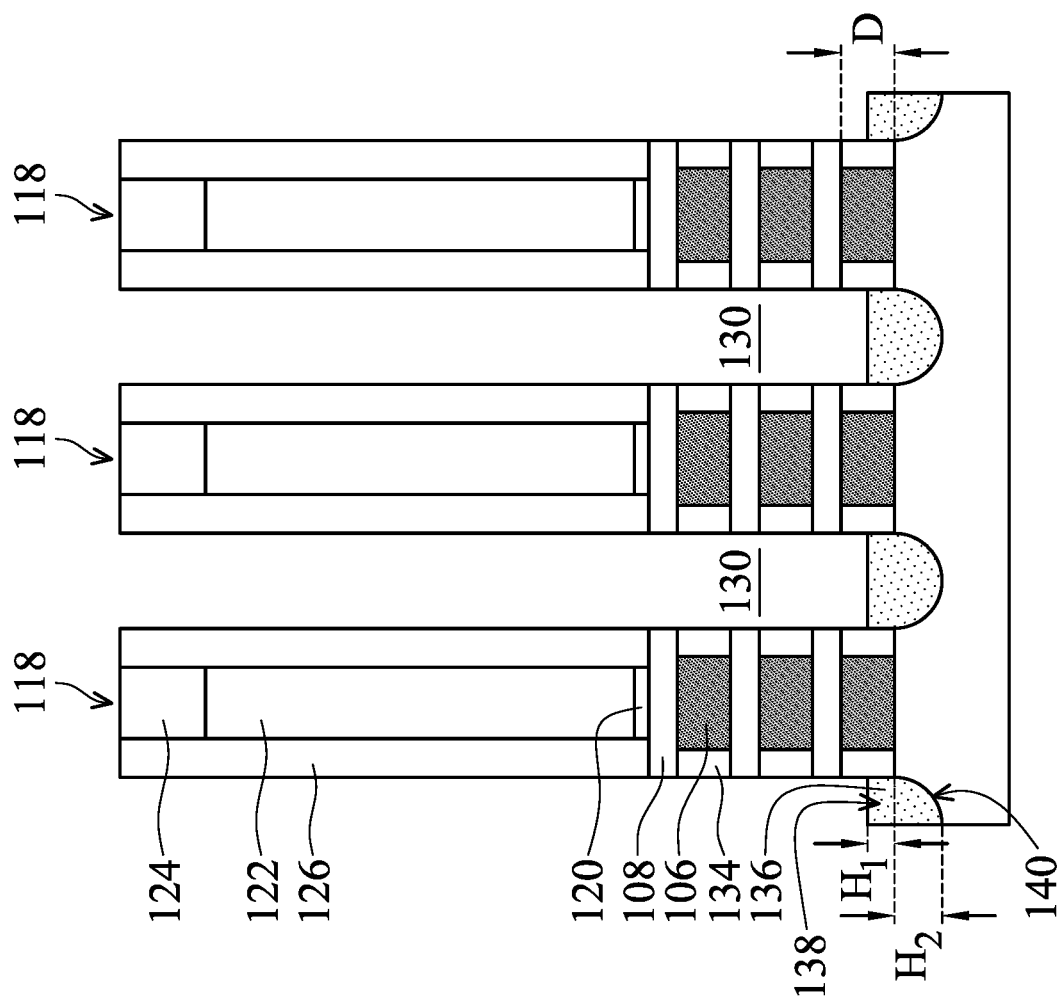
Figures 2, 2F:
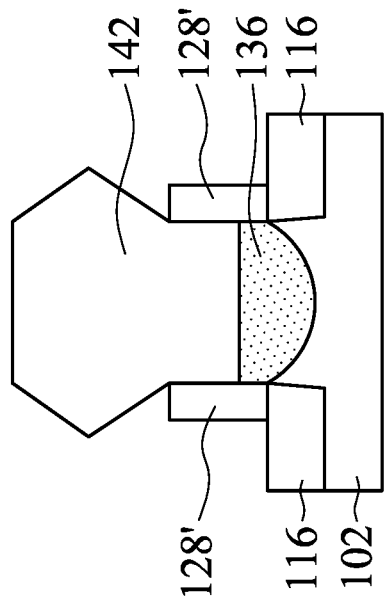
Figures 1, 2F:
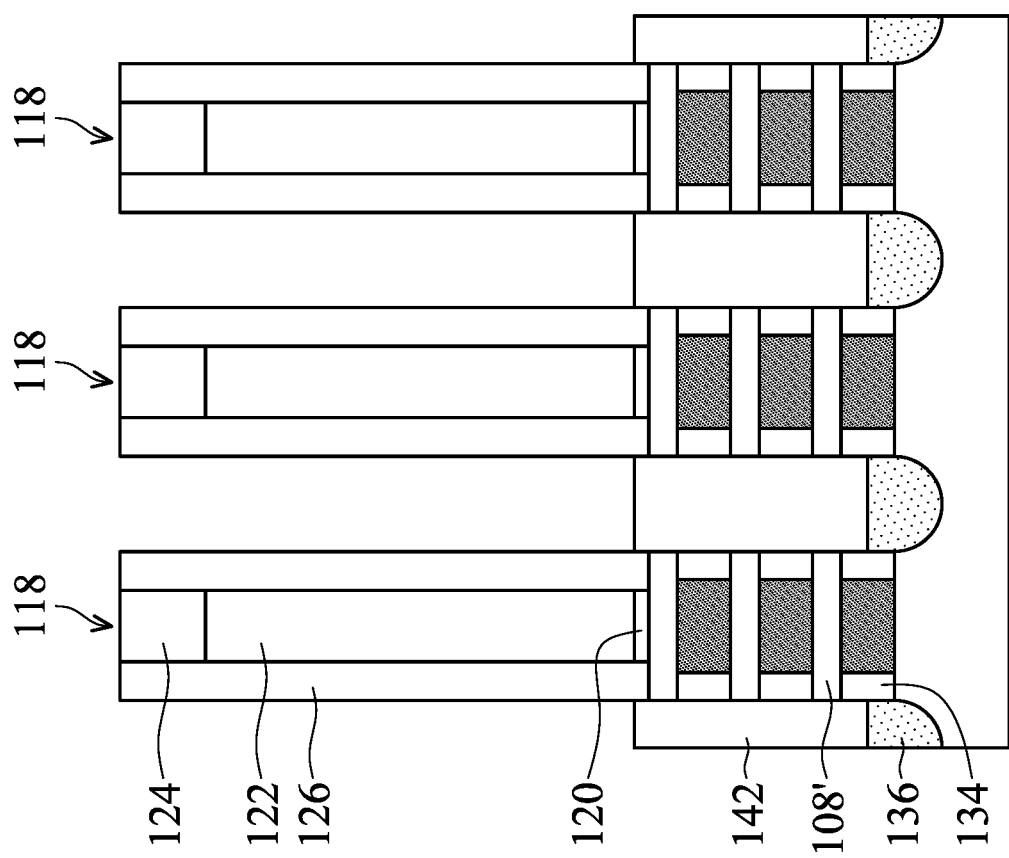
Figures 2, 2G:
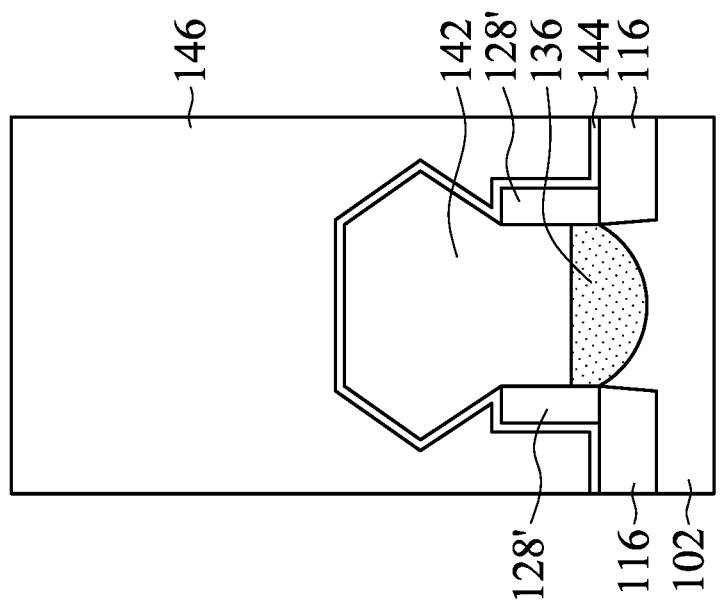
Figures 1, 2G:
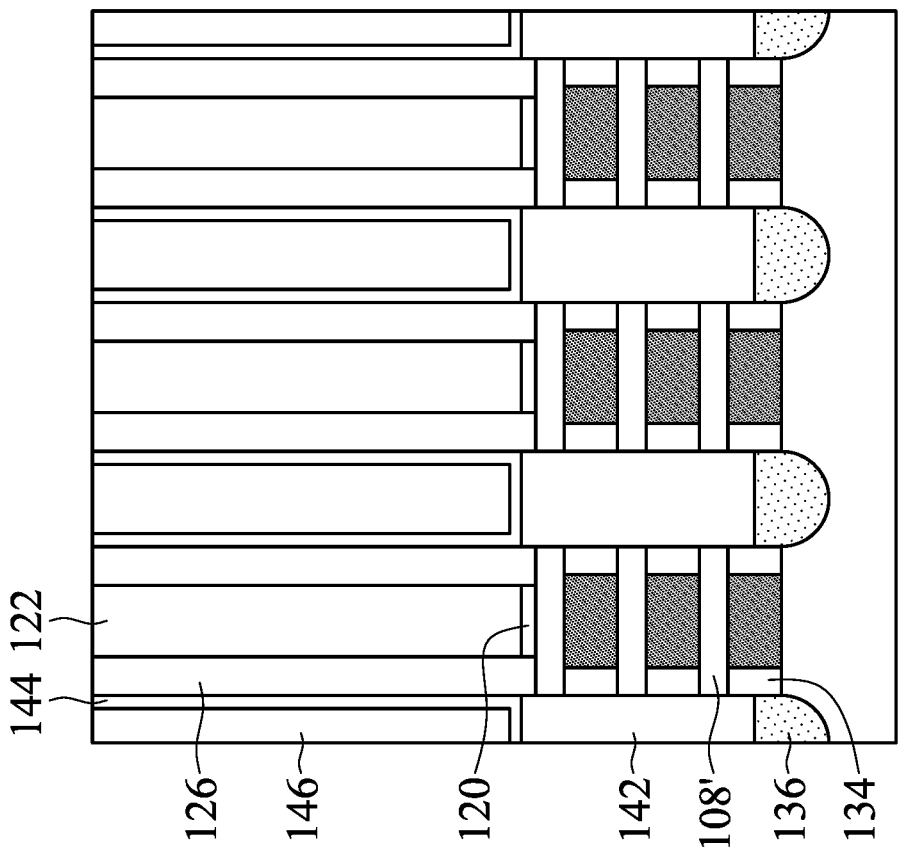
Figures 2, 2H:
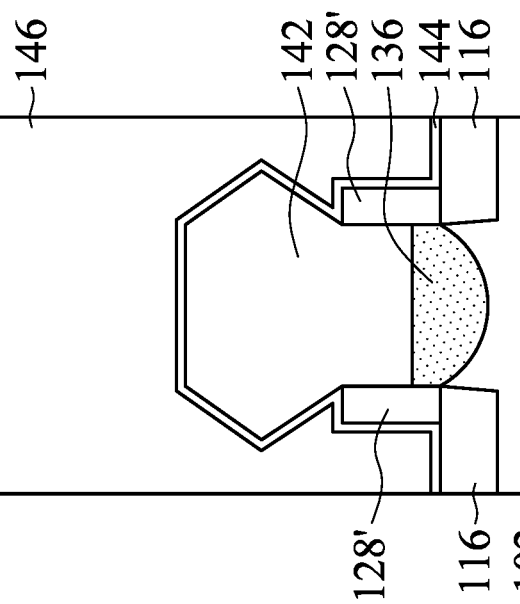
Figures 1, 2H:
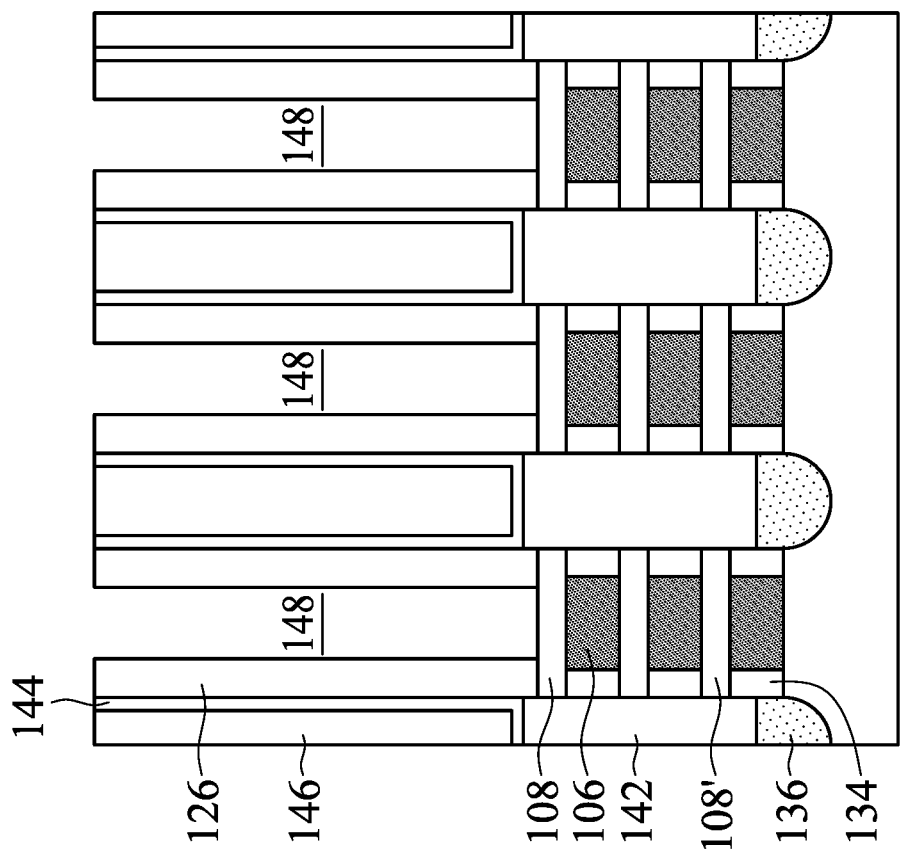
Figures 2, 2I:
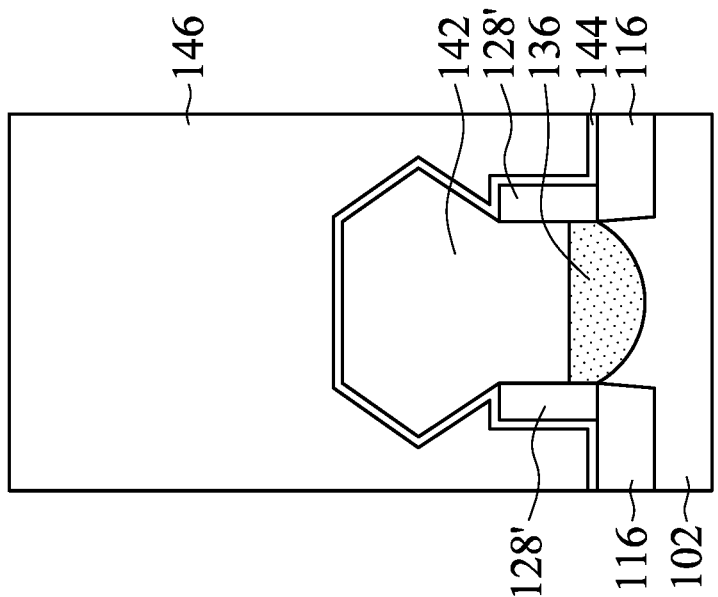
Figures 1, 2I:
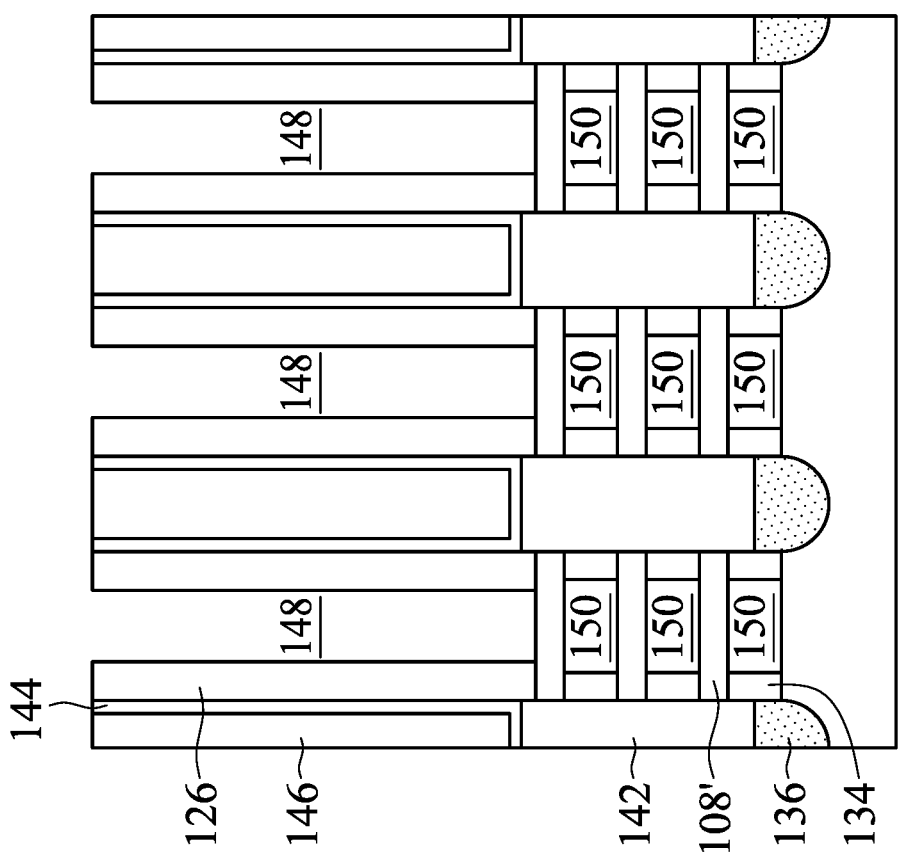
Figures 2, 2K:
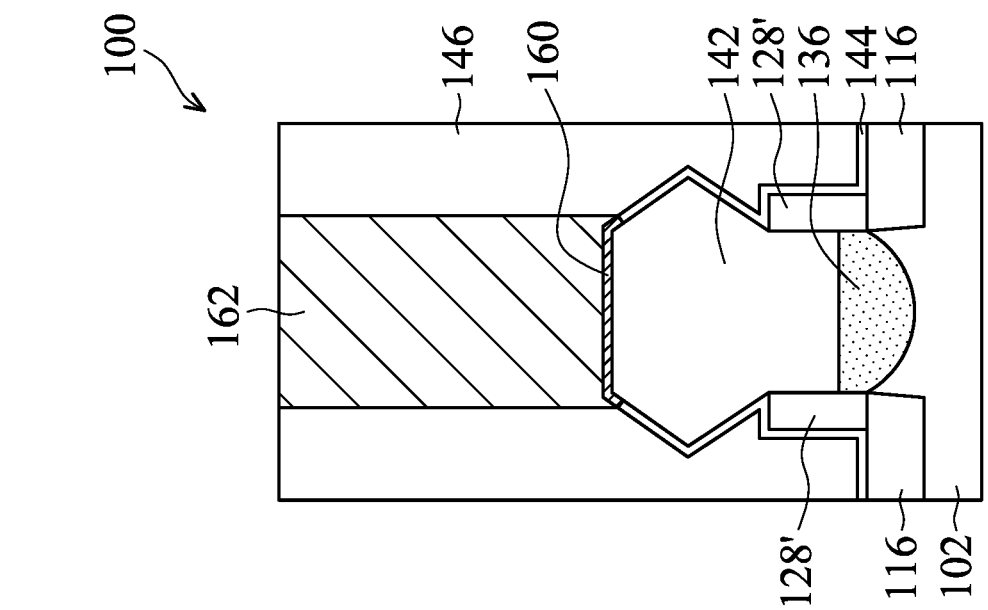
Figures 1, 2K:
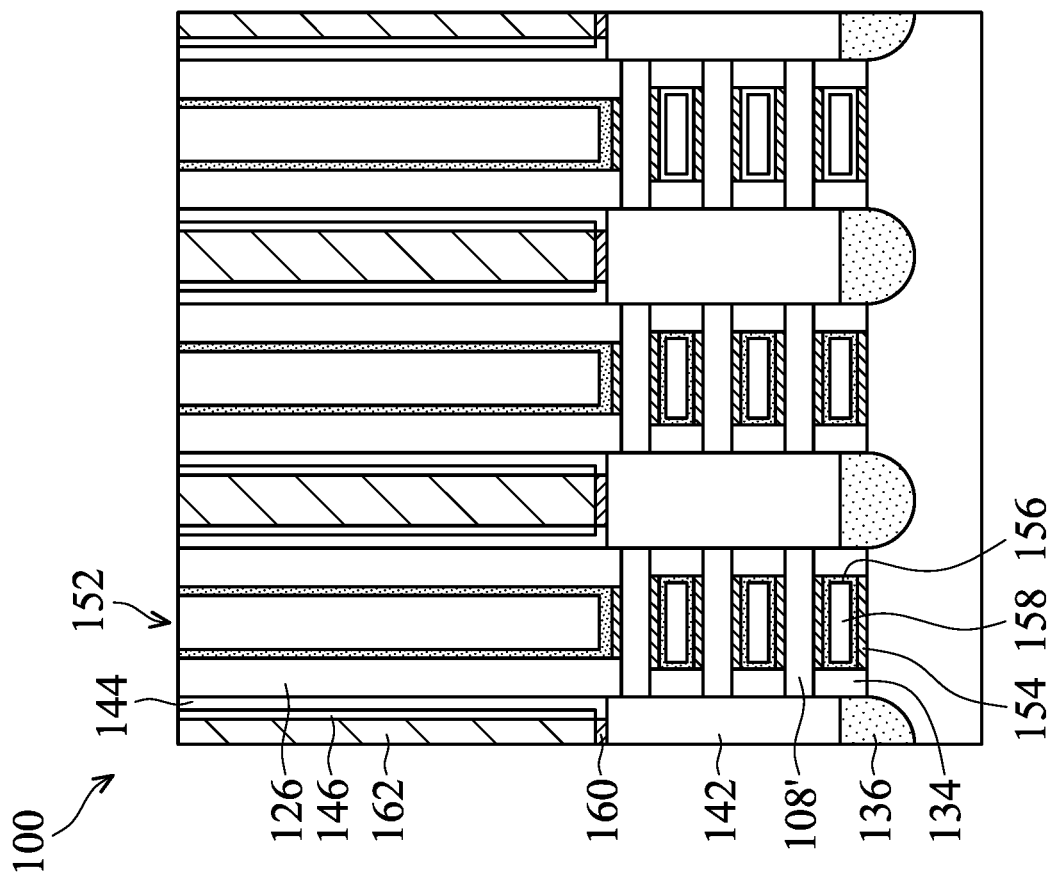

FIGS. 2A-1 to 2K-1 illustrate cross-sectional representations of various stages of manufacturing the semiconductor structure 100 shown along line A-A' in FIG. 1E in accordance with some embodiments. FIGS. 2A-2 to 2K-2 illustrate cross-sectional representations of various stages of manufacturing the semiconductor structure 100 shown along line B-B' in FIG. 1E in accordance with some embodiments. More specifically, FIG. 2A-1 illustrates the cross-sectional representation shown along line A-A' and FIG. 2A-2 illustrates the cross-sectional representation shown along line B-B' in FIG. 1E in accordance with some embodiments.

After the gate spacers 126 and the fin spacers 128 are formed, the source/drain regions of the fin structure 104 are recessed to form source/drain recesses 130, as shown in FIGS. 2B-1 and 2B-2 in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process.

In some embodiments, the bottom surfaces of the source/drain recesses 130 are lower than the top surface of the isolation structure 116. Since the source/drain recesses 130 may be formed by performing an etching process, the source/drain recesses 130 may not be too deep, or other portions of the semiconductor structures may be damaged during the etching process. In some embodiments, the source/drain recess 130 has a depth in a range from about 10 nm to about 30 nm. The depth of the source/drain recess may be measured from the bottommost portion of the source/drain recess 130 to the level of the original top surface of the base fin structure 104B. In some embodiments, the fin spacers 128 are also recessed to form lowered fin spacers 128'.

After the source/drain recesses 130 are formed, the first semiconductor material layers 106 exposed by the source/drain recesses 130 are laterally recessed to form notches 132, as shown in FIGS. 2C-1 and 2C-2 in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, inner spacers 134 are formed in the notches 132 between the second semiconductor material layers 108, as shown in FIGS. 2D-1 and 2D-2 in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof.

After the inner spacers 134 are formed, isolating features 136 are formed in the bottom portion of the source/drain recesses 130, as shown in FIGS. 2E-1 and 2E-2 in accordance with some embodiments. The isolating features 136 are configured to separate the base fin structure 104B and the source/drain structure formed afterwards, so that current leakage may be reduced in accordance with some embodiments.

In some embodiments, the isolating feature 136 includes an upper portion 138 and a bottom portion 140. The upper portion 138 may be defined as the portion of the isolating feature 136 being higher than the bottom surface of the bottommost inner spacer 134 and the bottom surface of the first semiconductor material layer 106. The bottom portion 140 may be defined as the portion of the isolating feature 136 being lower than the bottom surface of the bottommost inner spacer 134 and the bottom surface of the first semiconductor material layer 106.

In some embodiments, the thickness H1 of the upper portion 138 is smaller than the thickness H2 of the bottom portion 140. In some embodiments, the thickness H1 of the upper portion 138 of the isolating feature 136 is in a range from about 4 nm to about 8 nm. In some embodiments, the thickness H2 of the bottom portion 140 of the isolating feature 136 is in a range from about 10 nm to about 30 nm. The size of the isolating feature 136 may be adjusted to be thick enough so the current leakage may be reduced or prevented. On the other hand, the isolating feature may not be too thick, or the resistance of the resulting transistor may be increased. It should be noted that although the upper portion 138 and the bottom portion 140 are divided into two portions in FIG. 2E, the two portions are drawn to explain the feature more clearly. That is, no real interface exists between the two portions.

In some embodiments, a topmost portion (e.g. the top surface) of the upper portion 138 of the isolating features 136 is higher than the top surface of the base fin structure 104B and is lower than the bottommost surface of the bottommost second semiconductor material layers 108. In some embodiments, a ratio of the height H1 of the upper portion 138 of the isolating feature 136 to the distance D between the bottommost second semiconductor material layer 108 (which will be used as a nanostructure afterwards) and the base fin structure 104B is in a range from about ⅓ to about ⅔. In some embodiments, the distance D between the bottommost second semiconductor material layer 108 and the base fin structure 104B is in a range from about 8 nm to about 15 nm.

In some embodiments, the isolating features 136 are laterally sandwiched between the inner spacers 134 and in direct contact with the inner spacers 134. In some embodiments, a bottommost portion of the isolating features 136 is lower than the top surface of the isolation structure 116.

In some embodiments, the isolating features 136 are made of an undoped semiconductor material, such as undoped Si or undoped SiGe. The undoped semiconductor material may provide additional stress to the channel of the resulting transistor (e.g. PMOS transistor). In some embodiments, the isolating features 136 are formed by performing an epitaxial growth process. The epitaxial growth process may be molecular beam epitaxy (MBE) process, metal organic chemical vapor deposition (MOCVD) process, vapor phase epitaxy (VPE) process, or other applicable technique.

In some embodiments, the isolating features 136 are made of an insulating material and are formed by a deposition process, such as chemical vapor deposition (CVD), physical vapor deposition, (PVD), atomic layer deposition (ALD), or other applicable processes. In some embodiments, the isolating features 136 are made of metal oxide, silicon oxide, silicon nitride, silicon oxynitride (SiON), SiOCN, SiOC, SiCN, fluorine-doped silicate glass, or a combination thereof.

After the isolating features 136 are formed, source/drain structures 142 are formed over the isolating features 136 in the source/drain recesses 130, as shown in FIGS. 2F-1 and 2F-2 in accordance with some embodiments.

In some embodiments, the source/drain structures 142 are formed using an epitaxial growth process, such as MBE, MOCVD, VPE, other applicable epitaxial growth process, or a combination thereof. In some embodiments, the source/drain structures 142 are made of any applicable material, such as Ge, Si, GaAs, AlGaAs, SiGe, GaAsP, SiP, SiC, SiCP, or a combination thereof.

In some embodiments, the source/drain structures 142 are in-situ doped during the epitaxial growth process. For example, the source/drain structures 142 may be the epitaxially grown SiGe doped with boron (B). For example, the source/drain structures 142 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 142 are doped in one or more implantation processes after the epitaxial growth process.

In some embodiments, the source/drain structures 142 and the isolating features 136 are made of the same semiconductor material but the source/drain structures 142 are doped with dopants while the isolating features 136 are not. In some embodiments, the dopants in the source/drain structures 142 may diffuse into the isolating features 136 in subsequent manufacturing processes, such that the source/drain structures 142 and the isolating features 136 contain same dopants but the dopant concentration of the source/drain structures 142 is higher than the dopant concentration of the isolating features 136. In some embodiments, the base fin structure 104B, the isolating features 136, and the source/drain structures 142 are made of the same semiconductor material, but the dopant concentration of the source/drain structures 142 and the dopant concentration of the base fin structure 104B are both higher than the dopant concentration of the isolating features 136.

In some embodiments, the source/drain structures 142 and the isolating features 136 are made of different materials. In some embodiments, the source/drain structures 142 are made of a semiconductor material and the isolating features 136 are made of one or more dielectric materials.

After the source/drain structures 142 are formed, a contact etch stop layer (CESL) 144 is conformally formed to cover the source/drain structures 142 and an interlayer dielectric (ILD) layer 146 is formed over the contact etch stop layers 144, as shown in FIGS. 2G-1 and 2G-2 in accordance with some embodiments.

In some embodiments, the contact etch stop layer 144 is made of a dielectric materials, such as silicon nitride, silicon oxide, silicon oxynitride, another suitable dielectric material, or a combination thereof. The dielectric material for the contact etch stop layers 144 may be conformally deposited over the semiconductor structure by performing CVD, ALD, other application methods, or a combination thereof.

The interlayer dielectric layer 146 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 146 may be formed by chemical vapor deposition (CVD), physical vapor deposition, (PVD), atomic layer deposition (ALD), or other applicable processes.

After the contact etch stop layer 144 and the interlayer dielectric layer 146 are deposited, a planarization process such as CMP or an etch-back process may be performed until the dummy gate electrode layers 122 of the dummy gate structures 118 are exposed, as shown in FIG. 2G-1 in accordance with some embodiments.

Next, the dummy gate structures 118 are removed to form trenches 148, as shown in FIGS. 2H-1 and 2H-2 in accordance with some embodiments. More specifically, the dummy gate electrode layers 122 and the dummy gatedielectric layers 120 are removed to form the trenches 148 between the gate spacers 126 in accordance with some embodiments. The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching.

After the dummy gate structures 118 are removed, the first semiconductor material layers 106 are removed to form nanostructures 108', as shown in FIGS. 2I-1 and 2I-2 in accordance with some embodiments. More specifically, the second semiconductor material layers 108 remaining in the channel region form the nanostructures 108' and gaps 150 are formed between the nanostructures 108' in accordance with some embodiments. The nanostructures 108' are configured to function as channel regions in the resulting semiconductor structure 100.

The first semiconductor material layers 106 may be removed by performing an etching process. The etching process may include a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

After the nanostructures 108' are formed, gate structures 152 are formed in the trenches 148 and the gaps 150 between the nanostructures 108', as shown in FIGS. 2J-1 and 2J-2 in accordance with some embodiments. The gate structures 152 wrap around the nanostructures 108' to form gate-all-around transistor structures in accordance with some embodiments. In some embodiments, the gate structure 152 includes an interfacial layer 154, a gate dielectric layer 156, and a gate electrode layer 166.

In some embodiments, the interfacial layers 154 are oxide layers formed around the nanostructures 108' and on the top of the base fin structure 104B. In some embodiments, the interfacial layers 154 are formed by performing a thermal process.

In some embodiments, the gate dielectric layers 156 are formed over the interfacial layers 154, so that the nanostructures 108' are surrounded (e.g. wrapped) by the gate dielectric layers 156. In addition, the gate dielectric layers 156 also cover the sidewalls of the gate spacers 126 and the inner spacers 134 in accordance with some embodiments. In some embodiments, the gate dielectric layers 156 are made of one or more layers of dielectric materials, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 156 are formed using CVD, ALD, another applicable method, or a combination thereof.

The gate electrode layers 158 are formed on the gate dielectric layer 156 and filled in the trenches 148 and the gaps 150 between the nanostructures 108', so that the nanostructures 108' are wrapped by the gate structures 152 in accordance with some embodiments.

In some embodiments, the gate electrode layers 158 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 158 are formed using CVD, ALD, electroplating, another applicable method, or a combination thereof. Other conductive layers, such as work function metal layers, may also be formed in the gate structures 52, although they are not shown in the figures. After the interfacial layers 154, the gate dielectric layers 156, and the gate electrode layers 158 are formed, a planarization process such as CMP or an etch-back process may be performed until the interlayer dielectric layer 146 is exposed.

After the gate structures 152 are formed, silicide layers 160 and contacts 162 are formed over the source/drain structures 142, as shown in FIGS. 2K-1 and 2K-2 in accordance with some embodiments. More specifically, contact openings may be formed through the contact etch stop layer 144 and the interlayer dielectric layer 146 to expose the top surfaces of the source/drain structures 142, and the silicide layers 160 and the contacts 162 may be formed in the contact openings. The contact openings may be formed using a photolithography process and an etching process. In addition, some portions of the source/drain structures 142 exposed by the contact openings may also be etched during the etching process.

After the contact openings are formed, the silicide layers 160 may be formed by forming a metal layer over the top surface of the source/drain structures 142 and annealing the metal layer so the metal layer reacts with the source/drain structures 142 to form the silicide layers 160. The unreacted metal layer may be removed after the silicide layers 160 are formed.

Afterwards, the contacts 162 are formed over the silicide layers 160 in the contact openings, as shown in FIGS. 2K-1 and 2K-2 in accordance with some embodiments. In some embodiments, the contacts 162 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantulum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The contacts 162 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described above, the semiconductor structure 100 includes the isolating features 136 interpose between the source/drain structures 142 and the base fin structure 104B in accordance with some embodiments. The formation of the isolating features 136 may help to block the current flow of the parasitic device, and therefore the dominating leakage path of the semiconductor structure 100 may be cut-off. Accordingly, the performance of the semiconductor structure 100 may be improved.

Figures 2, 3A:
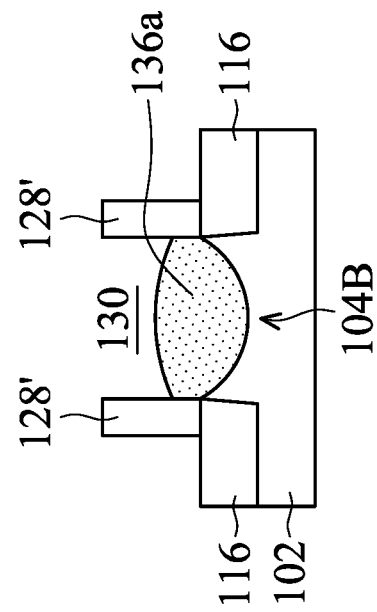
Figures 1, 3A:
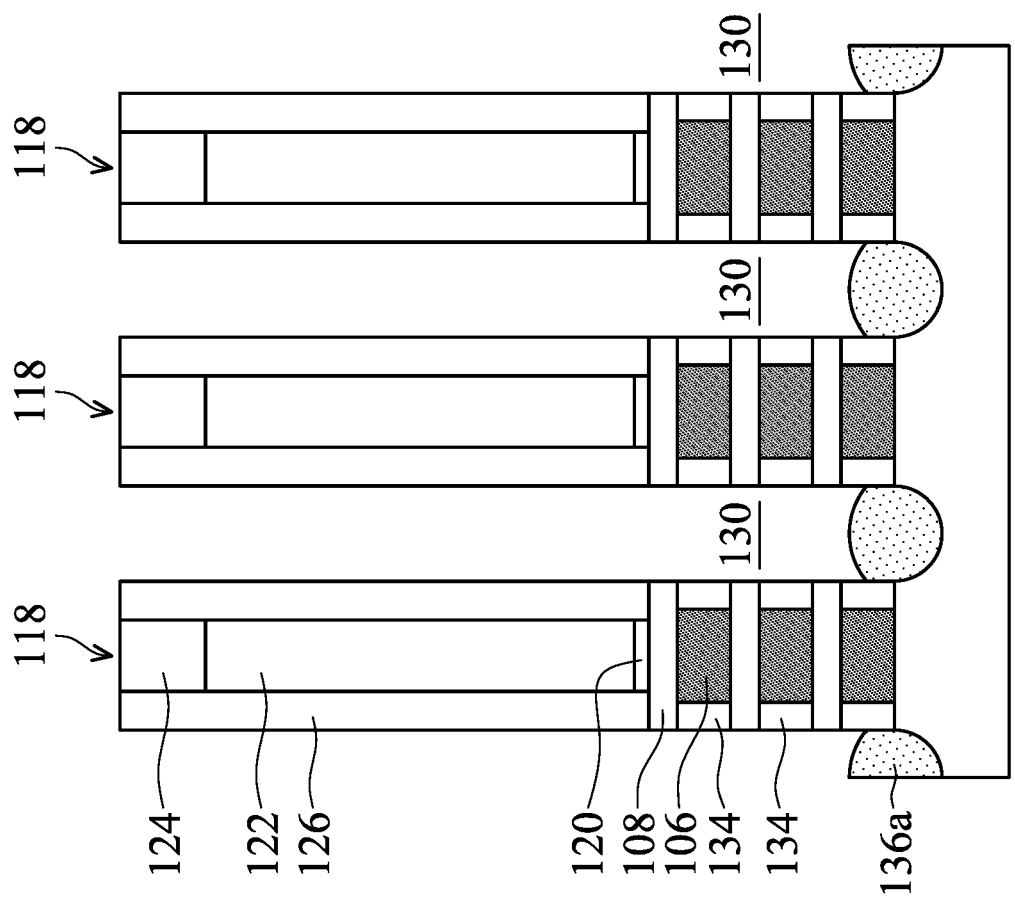
Figures 1, 3B:
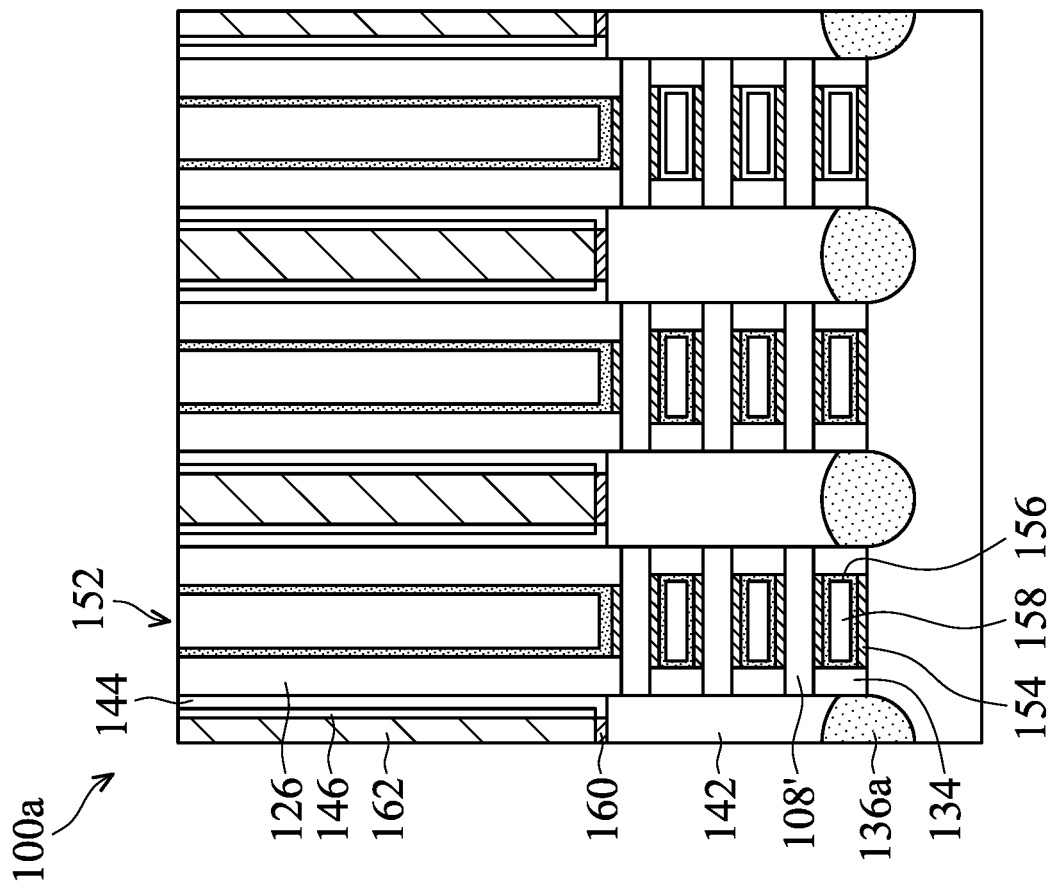
Figures 2, 3B:
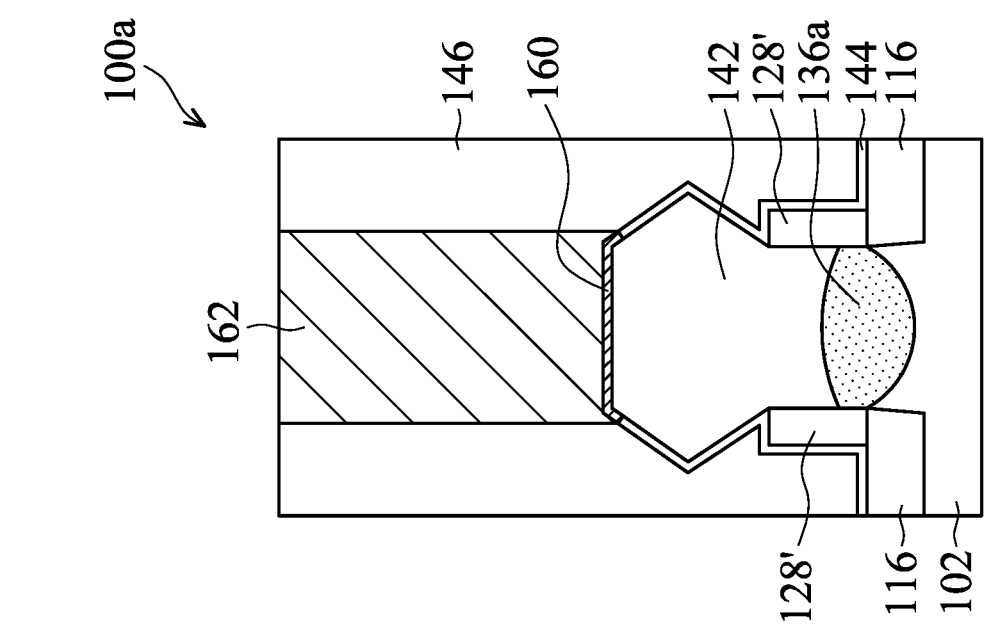

FIGS. 3A-1 and 3B-1 illustrate cross-sectional representations of various stages of manufacturing a semiconductor structure 100a shown along line A-A' in FIG. 1E in accordance with some embodiments. FIGS. 3A-2 and 3B-2 illustrate cross-sectional representations of various stages of manufacturing the semiconductor structure 100a shown along line B-B' in FIG. 1E in accordance with some embodiments. The semiconductor structure 100a may be the same as the semiconductor structure 100 described above, except the top surfaces of the isolating features in the semiconductor structure 100a are not flat. Some processes and materials for forming the semiconductor structure 100a may be similar to, or the same as, those for forming the semiconductor structure 100 and are not repeated herein.

More specifically, the processes shown in FIGS. 1A to 1E, 2A-1 to 2D-1, and 2A-2 to 2D-2 and described previously are performed to form the fin structure 104 including the first semiconductor material layers 106 and the second semiconductor material layers 108 over the base fin structure 104B, the isolation structure 116, the dummy gate structures 118, the gate spacers 126, the fin spacers 128', and the inner spacers 134 in accordance with some embodiments. Next, isolating features 136a are formed in the bottom portion of the source/drain recesses 130, as shown in FIGS. 3A-1 and 3A-2 in accordance with some embodiments.

In some embodiments, the isolating features 136a are made of undoped semiconductor material (e.g. undoped Si or undoped SiGe) formed by performing an epitaxial growth process. The epitaxial growth process may be molecular beam epitaxy (MBE) process, metal organic chemical vapor deposition (MOCVD) process, vapor phase epitaxy (VPE) process, or other applicable technique. During the formation of the isolating feature 136a, a growth rate of the middle portion of the isolating feature 136a may be greater than the edge portion, and therefore the middle portion of the resulting isolating feature 136a has a thickness greater than that at the edge portion in accordance with some embodiments. In some embodiments, the isolating feature 136a has a curved (e.g. convex) top surface.

After the isolating features 136a are formed, processes shown in FIGS. 2F-1 to 2K-1 and 2F-2 to 2K-2 described previously are performed to form the semiconductor structure 100a, as shown in FIGS. 3B-1 and 3B-2 in accordance with some embodiments. In some embodiments, the semiconductor structure 100a is a PMOS transistor and the isolating features 136a can provide additional stress to the nanostructures 108'. In some embodiments, the isolating features 136a may be formed in both PMOS and NMOS transistors.

As shown in FIG. 3B-1, although the middle portion of the isolating features 136a is relatively thicker than the edge portion, the top surfaces of the isolating features 136a are still lower than the bottommost surface of the nanostructures 108', so that the resistance of the semiconductor structure 100a will not be affected too much in accordance with some embodiments.

Figures 2, 4B:
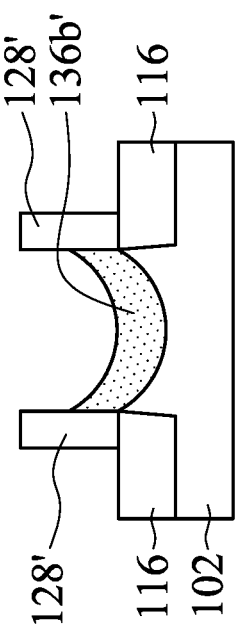
Figures 1, 4B:
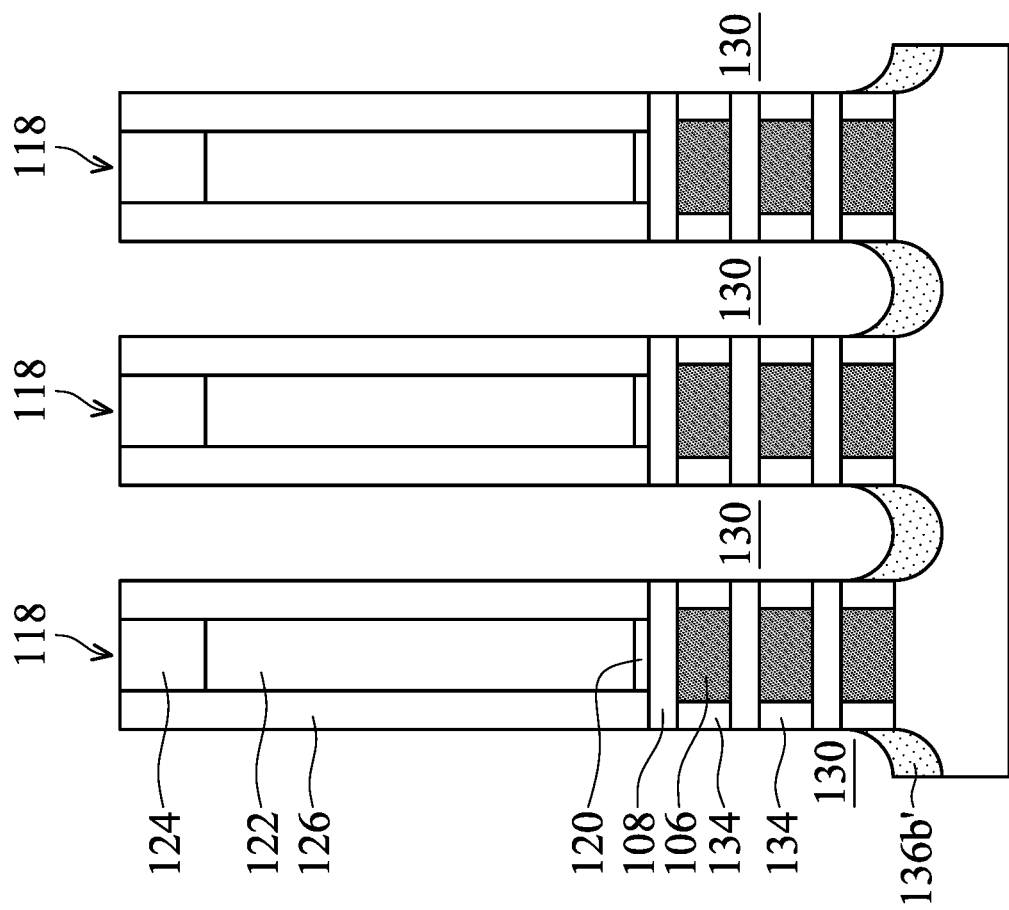
Figures 2, 4C:
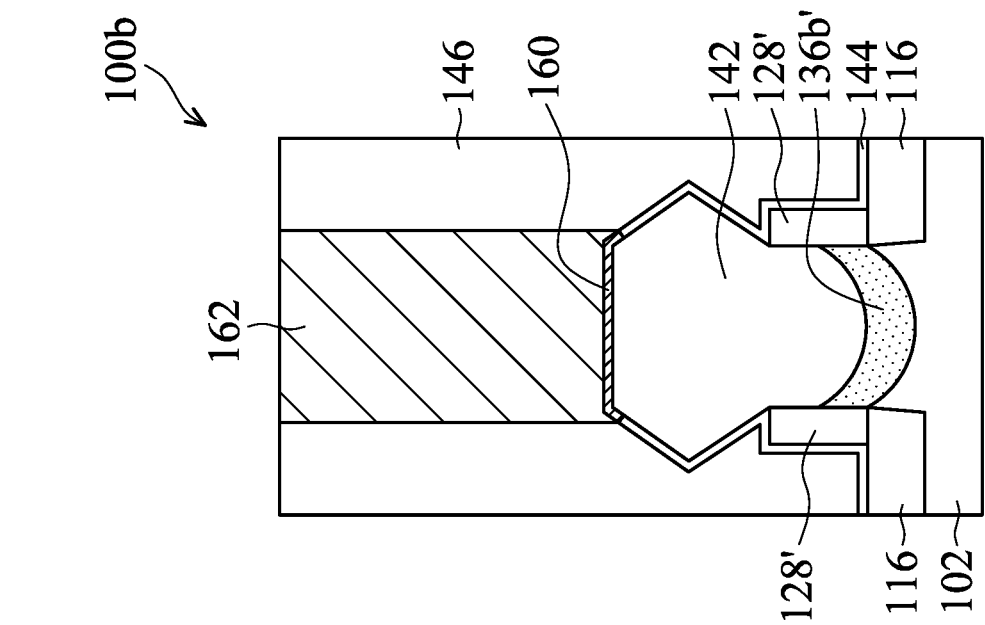
Figures 1, 4C:
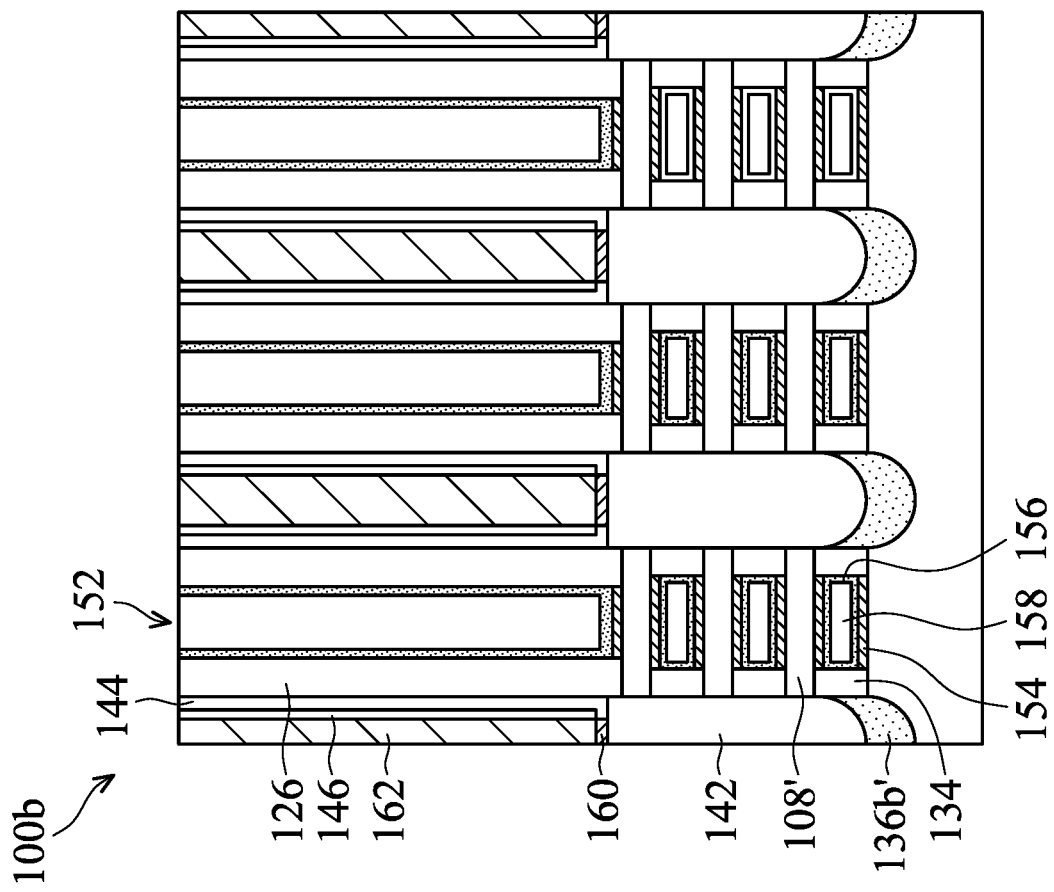

FIGS. 4A-1 to 4C-1 illustrate cross-sectional representations of various stages of manufacturing a semiconductor structure 100b shown along line A-A' in FIG. 1E in accordance with some embodiments. FIGS. 4A-2 and 4C-2 illustrate cross-sectional representations of various stages of manufacturing the semiconductor structure 100b shown along line B-B' in FIG. 1E in accordance with some embodiments. The semiconductor structure 100b may be the same as the semiconductor structure 100 described above, except the formation of the isolating features of the semiconductor structure 100b is different from that of the semiconductor structure 100. Some processes and materials for forming the semiconductor structure 100b may be similar to, or the same as, those for forming the semiconductor structure 100 and are not repeated herein.

Similar to those for forming the semiconductor structure 100a, the processes shown in FIGS. 1A to 1E, 2A-1 to 2D-1, and 2A-2 to 2D-2 and described previously are performed in accordance with some embodiments. Next, isolating features 136b are formed in the bottom portion of the source/drain recesses 130, as shown in FIGS. 4A-1 and 4A-2 in accordance with some embodiments.

In some embodiments, the isolating features 136b are made of undoped semiconductor material (e.g. undoped Si or undoped SiGe) formed by performing an epitaxial growth process. The formation of the isolating features 136b may be similar to, or the same as, that of the isolating features 136a, except the thickness of the isolating feature 136b may be greater than the thickness of the isolating feature 136a. In some embodiments, the topmost portion of the isolating features 136b is higher than the bottommost portion of the nanostructures 108'.

After the isolating features 136b are formed, an etching process may be performed to form modified isolating features 136b', as shown in FIGS. 4B-1 and 4B-2 in accordance with some embodiments. More specifically, the upper portions of the isolating features 136b are removed, so that the middle portions of the modified isolating features 136b' become thinner than the edge portions of the modified isolating features 136b' in accordance with some embodiments. That is, the top surface of the middle portion of the modified isolating features 136b' is lower than the top surface of the edge portion of the modified isolating features 136b' in accordance with some embodiments. In some embodiments, the modified isolating feature 136b' has a curved (e.g. concave) top surface.

After the modified isolating feature 136b' are formed, processes shown in FIGS. 2F-1 to 2K-1 and 2F-2 to 2K-2 described previously are performed to form the semiconductor structure 100b, as shown in FIGS. 4C-1 and 4C-2 in accordance with some embodiments. Similarly, the semiconductor structure 100b is a PMOS transistor and the modified isolating feature 136b' can provide additional stress to the nanostructures 108' in accordance with some embodiments. In some embodiments, the modified isolating feature 136b' are formed in both PMOS and NMOS transistors.

Since an additional etching process is performed, the top surfaces of the modified isolating features 136b' are lower than the bottommost surface of the nanostructures 108', so that the resistance of the semiconductor structure 100b will not be affected too much in accordance with some embodiments.

Figures 1, 2, 5A:
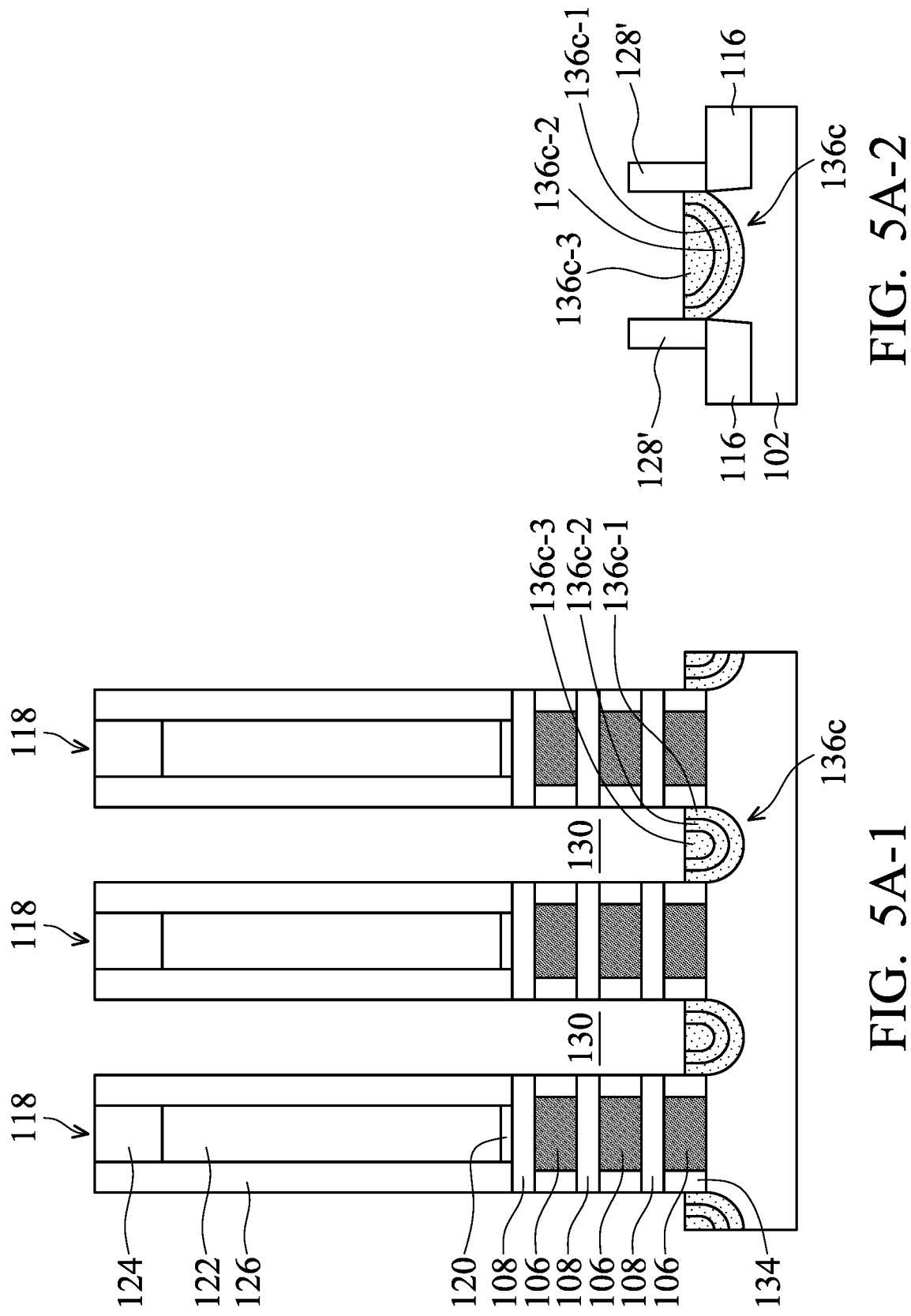
Figures 2, 5B:
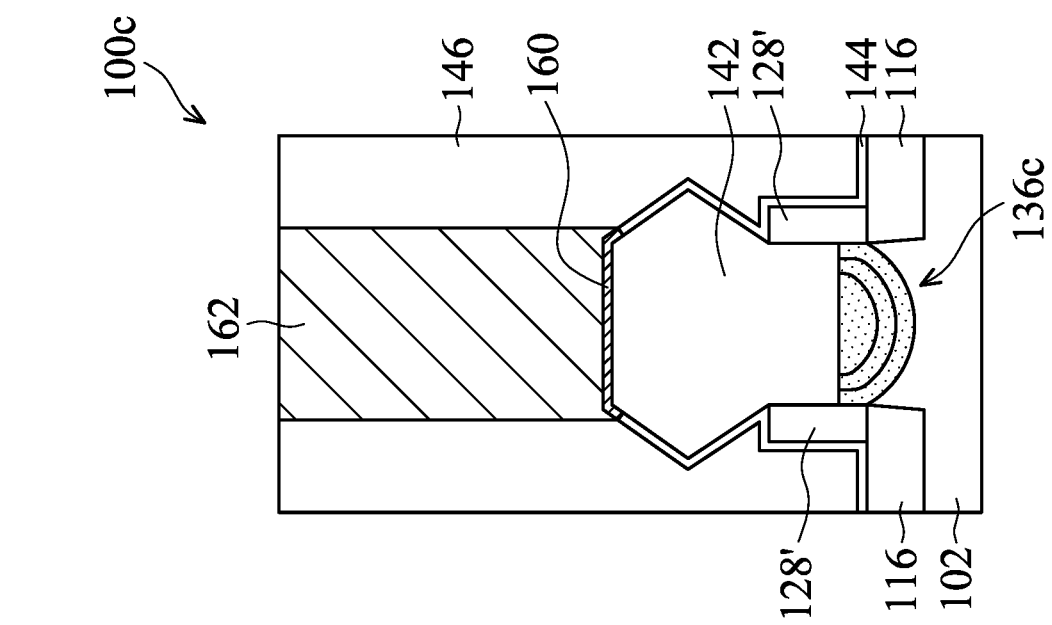
Figures 1, 5B:
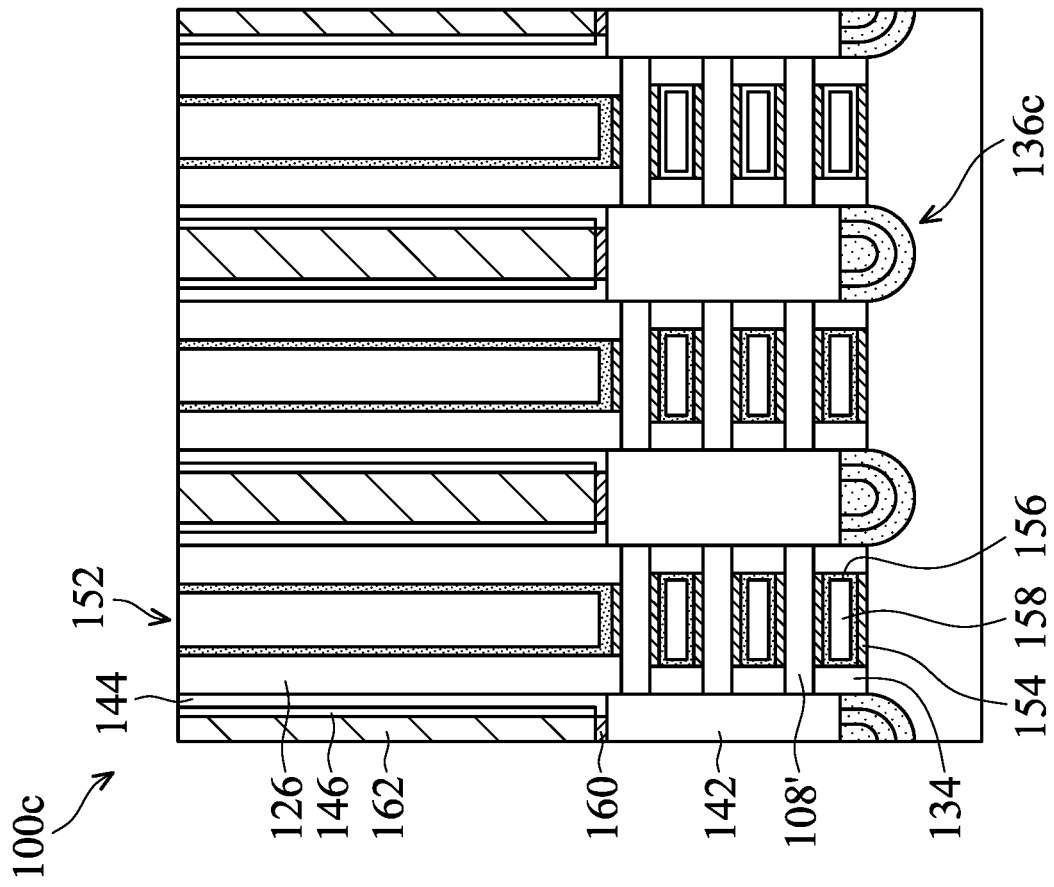

FIGS. 5A-1 and 5B-1 illustrate cross-sectional representations of various stages of manufacturing a semiconductor structure 100c shown along line A-A' in FIG. 1E in accordance with some embodiments. FIGS. 5A-2 and 5B-2 illustrate cross-sectional representations of various stages of manufacturing the semiconductor structure 100c shown along line B-B' in FIG. 1E in accordance with some embodiments. The semiconductor structure 100c may be the same as the semiconductor structure 100 described above, except the isolating features in the semiconductor structure 100c are formed of multiple layers. Some processes and materials for forming the semiconductor structure 100c may be similar to, or the same as, those for forming the semiconductor structure 100 and are not repeated herein.

More specifically, the processes shown in FIGS. 1A to 1E, 2A-1 to 2D-1, and 2A-2 to 2D-2 and described previously may be performed. Next, isolating features 136c are formed in the bottom portion of the source/drain recesses 130, as shown in FIGS. 5A-1 and 5A-2 in accordance with some embodiments.

In some embodiments, the isolating feature 136c includes a first dielectric layer 136c-1, a second dielectric layer 136c-2, and a third dielectric layer 136c-3. In some embodiments, the dielectric constant of the first dielectric layer 136c-1 is greater than the dielectric constant of the second dielectric layer 136c-2 and the dielectric constant of the third dielectric layer 136c-3. The first dielectric layer 136c-1 with a relatively high dielectric constant may help to reduce the parasitic capacitance of the resulting semiconductor structure 100c.

In some embodiments, the first dielectric layer 136c-1, the second dielectric layer 136c-2, and the third dielectric layer 136c-3 are made of different materials. In some embodiments, the first dielectric layer 136c-1 is made of $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, or other applicable high-k dielectric materials. In some embodiments, the second dielectric layer 136c-2 is made of silicon oxide, silicon nitride, silicon oxynitride, phosphosilicate glass (PSG), borophosphosilicate glass (BPSG), or other applicable low-k dielectric materials. In some embodiments, the third dielectric layer 136c-2 is made of silicon oxide, silicon nitride, silicon oxynitride, phosphosilicate glass (PSG), borophosphosilicate glass (BPSG), or other applicable low-k dielectric materials.

The isolating feature 136c may be formed by forming the first dielectric layer 136c-1, the second dielectric layer 136c-2, and the third dielectric layer 136c-3 to completely fill the source/drain recesses 130, and etching back the first dielectric layer 136c-1, the second dielectric layer 136c-2, and the third dielectric layer 136c-3 to form the isolating feature 136c in accordance with some embodiments.

After the isolating features 136c are formed, processes shown in FIGS. 2F-1 to 2K-1 and 2F-2 to 2K-2 described previously are performed to form the semiconductor structure 100c, as shown in FIGS. 5B-1 and 5B-2 in accordance with some embodiments. In some embodiments, the semiconductor structure 100c is a NMOS transistor. In some embodiments, the isolating features 136c are formed in a NMOS transistor, and the isolating features 136, 136a, and/or 136b are formed in a PMOS transistor. As shown in FIG. 5B-1, the isolating features 136c and the source/drain structures 142 have substantially flat interfaces therebetween in accordance with some embodiments.

Figures 1, 2, 6B:
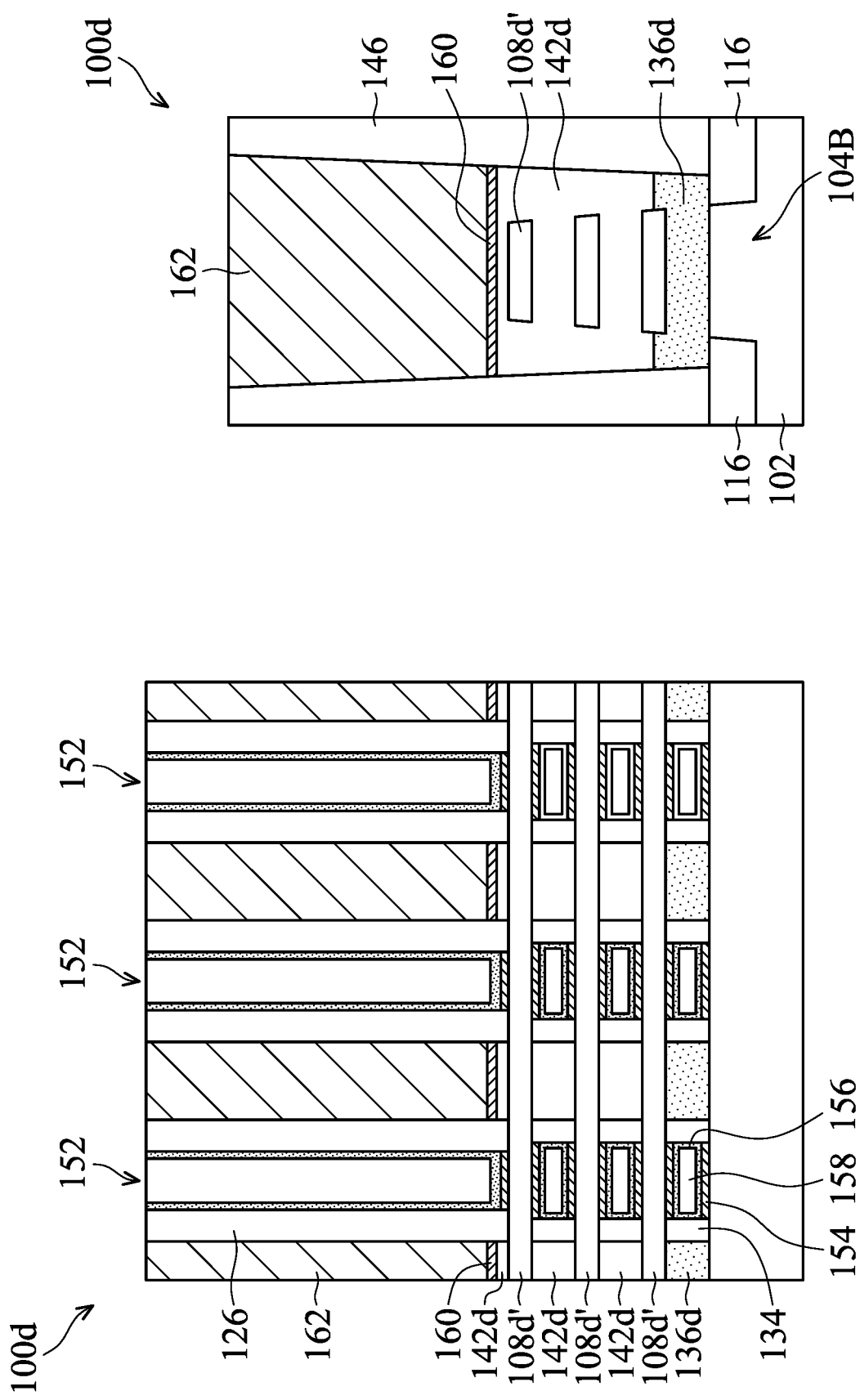

FIGS. 6A-1 and 6B-1 illustrate cross-sectional representations of various stages of manufacturing a semiconductor structure 100d shown along fin direction and FIGS. 6A-2 and 6B-2 illustrate cross-sectional representations of various stages of manufacturing the semiconductor structure 100d shown along gate direction in accordance with some embodiments. Some processes and materials for forming the semiconductor structure 100d may be similar to, or the same as, those for forming the semiconductor structure 100 described previously and are not repeated herein.

More specifically, the processes similar to those shown in FIGS. 1A to 1D and described previously are performed to form the fin structure 104 including the first semiconductor material layers 106 and the second semiconductor material layers 108 formed over the base fin structure 104B, the isolation structure 116 formed around the fin structure 104, and the dummy gate structures 118 formed across the fin structure 104 in accordance with some embodiments. In addition, the gate spacers 126 are formed on the sidewalls of the dummy gate structures 118 in accordance with some embodiments.

Next, the first semiconductor material layers 106 at the source/drain region are removed, as shown in FIGS. 6A-1 and 6A-2 in accordance with some embodiments. More specifically, the second semiconductor material layers 108 at the source/drain region are not removed, so that nanostructures 108' are formed in the source/drain region in accordance with some embodiments.

Afterwards, isolating features 136d are formed in the bottom portions of the source/drain trenches 130d, as shown in FIGS. 6B-1 and 6B-2 in accordance with some embodiments. The processes and materials for forming the isolating features 136d may be similar to, or the same as, those for forming the isolating features 136 described previously.

In some embodiments, the isolating features 136d are made of an insulating material. In some embodiments, the isolating features 136d are made of metal oxide, silicon oxide, silicon nitride, silicon oxynitride (SiON), SiOCN, SiOC, SiCN, fluorine-doped silicate glass, or a combination thereof.

In some embodiments, the isolating features 136d are formed by depositing an insulating material by a deposition process, such as chemical vapor deposition (CVD), physical vapor deposition, (PVD), atomic layer deposition (ALD), or other applicable processes and partially etching the insulating material to form the isolating features 136d to cover the base fin structure 104B.

In some embodiments, the top surface of the isolating feature 136d is higher than the bottom surface of the bottommost nanostructures 108' but lower than the top surface of the bottommost nanostructures 108'. In some embodiments, the bottommost nanostructures 108' is partially embedded in the isolating features 136d so that the current leakage may be reduced.

Next, source/drain structures 142d are formed over the isolating features 136d in the source/drain trenches 130d, as shown in FIGS. 6B-1 and 6B-2 in accordance with some embodiments. The processes and materials for forming the source/drain structures 142d may be similar to, or the same as, those for forming the source/drain structures 142 described previously and are not repeated herein. As described previously, the nanostructures 108' are formed in the source/drain regions, and the source/drain structures 142d formed afterwards wrap around the nanostructures 108', as shown in FIGS. 6B-1 and 6B-2 in accordance with some embodiments. In some embodiments, the top surfaces of the bottommost nanostructures 108' are covered by the source/drain structures 142d and the bottom surfaces of the bottommost nanostructures 108' are covered by the isolating features 136d.

After the source/drain structures 142d are formed, processes shown in FIGS. 2G-1 to 2K-1 and 2G-2 to 2K-2 described previously are performed to form the semiconductor structure 100d, as shown in FIGS. 6B-1 and 6B-2 in accordance with some embodiments. More specifically, the contact etch stop layer (CESL) (not shown) and an interlayer dielectric (ILD) layer 146 are formed and the dummy gate structures 118 and the first semiconductor material layers 106 are removed to form the nanostructures 108d' in accordance with some embodiments. Afterwards, the gate structures 152 are formed to wrap around the nanostructures 108d' and silicide layers 160 and the contact 162 are formed over the source/drain structure 142*d*, as shown in FIGS. 6B-1 and 6B-2 in accordance with some embodiments.

Similar to those described above, since the semiconductor structure 100*d* includes the isolating features 136*d* interpose between the source/drain structures 142*d*/nanostructures 108' and the base fin structure 104B, the current leakage of the transistor may be reduced. Therefore, the performance of the semiconductor structure 100*d* may be improved.

FIGS. 7A-1 and 7A-2 illustrate cross-sectional representations of a semiconductor structure 100*e* in accordance with some embodiments. The semiconductor structure 100*e* may be the same as the semiconductor structure 100*d* described above, except the top surfaces of the isolating features in the semiconductor structure 100*e* is substantially level with the bottommost nanostructure 108'. Processes and materials for forming the semiconductor structure 100*e* similar to, or the same as, those for forming the semiconductor structure 100*d* are not repeated herein.

More specifically, the nanostructures 108' extending into the source/drain regions are wrapped around by the source/drain structures 142*e*, and isolating features 136*e* are interposed between the source/drain structures 142*e* and the base fin structure 104B in accordance with some embodiments. The processes and materials for forming the source/drain structures 142*e* and the isolating features 136*e* may be similar to, or the same as, those for forming the source/drain structures 142 and the isolating features 136 described previously and therefore are not repeated herein.

Figure 8:
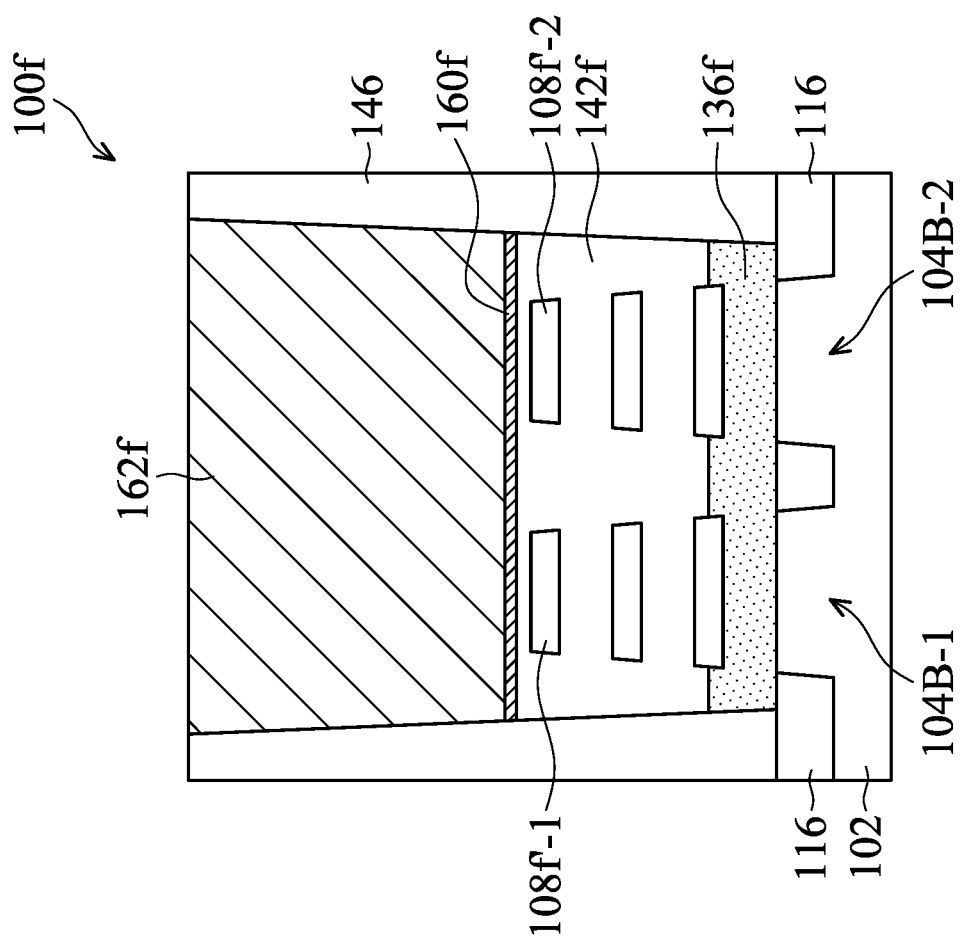
FIG. 8 illustrates a cross-sectional representation of a semiconductor structure in accordance with some embodiments.

FIG. 8 illustrates a cross-sectional representation of a semiconductor structure 100*f* in accordance with some embodiments. The semiconductor structure 100*f* may be the same as the semiconductor structure 100*d* described above, except the source/drain structures at two fin structures merged into one in accordance with some embodiments. Processes and materials for forming the semiconductor structure 100*f* similar to, or the same as, those for forming the semiconductor structure 100*d* are not repeated herein.

More specifically, the processes shown in FIGS. 6A-1 and 6A-2, 6B-1 may be performed. Afterwards, the first semiconductor material layers 106 in the source/drain region of the fin structures are removed to form nanostructures 108*f*'-1 and 108*f*'-2 in accordance with some embodiments.

Next, an isolating feature 136*f* is formed at the bottom portion of the source/drain region to cover both base fin structures 104B-1 and 104B-2 in accordance with some embodiments. The processes and materials for forming the isolating feature 136*f* may be similar to, or the same as, those for forming the isolating feature 136*d* described previously and are not repeated herein.

After the isolating feature 136*f* is formed, a source/drain structure 142*f* is formed over the isolating feature 136*f*, as shown in FIG. 8 in accordance with some embodiments. The processes and materials for forming the source/drain structure 142*f* may be similar to, or the same as, those for forming the source/drain structure 142 described previously and are not repeated herein.

After the source/drain structures 142*f* are formed, processes shown in FIGS. 2G-1 to 2J-1 and 2G-2 to 2J-2 described previously are performed to form the semiconductor structure 100*f*, and a silicide layer 160*f* and a contact 162*f* are formed over the source/drain structures 142*f*, as shown in FIG. 8 in accordance with some embodiments. The processes and materials for forming the silicide layer 160*f* and the contact 162*f* may be similar to, or the same as, those for forming the silicide layer 160, and the contact 162 described previously and are not repeated herein.

As shown in FIG. 8, the nanostructures 108*f*'-1 and 108*f*'-2 are wrapped by the source/drain structure 142*f* in accordance with some embodiments. In some embodiments, the interface between the source/drain structure 142*f* and the isolating feature 136*f* is at a level between the top surfaces and the bottom surfaces of the bottommost nanostructures 108*f*'-1 and 108*f*'-2. In some embodiments, the isolating feature 136*f* is interposed between the source/drain structure 142*f* and the isolation structure 116.

Figure 9:
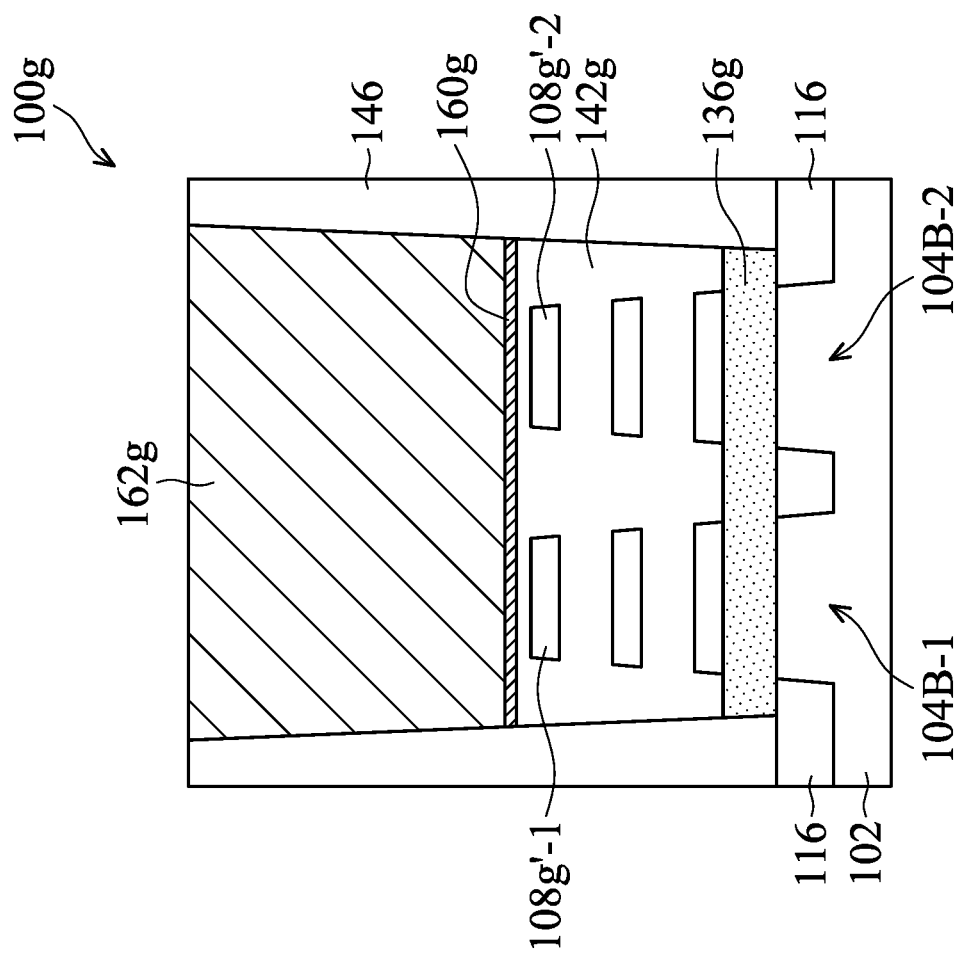
FIG. 9 illustrates a cross-sectional representation of a semiconductor structure in accordance with some embodiments.

FIG. 9 illustrates a cross-sectional representation of a semiconductor structure 100*g* in accordance with some embodiments. The semiconductor structure 100*g* may be the same as the semiconductor structure 100*f* described above, except the top surface of the isolating feature 136*g* in the semiconductor structure 100*g* is substantially level with the bottommost nanostructures in accordance with some embodiments. Processes and materials for forming the semiconductor structure 100*g* similar to, or the same as, those for forming the semiconductor structure 100*f* are not repeated herein.

More specifically, the nanostructures 108*g*'-1 and 108*g*'-2 are wrapped around by a source/drain structure 142*g*, and an isolating feature 136*g* is interposed between the source/drain structures 142*g* and the base fin structures 104B-1 and 104B-2 in accordance with some embodiments. Next, a silicide layer 160*g* and a contact 162*g* are formed over the source/drain structures 142*g* in accordance with some embodiments.

The processes and materials for forming the source/drain structure 142*g*, the isolating feature 136*g*, the silicide layer 160*g*, and the contact 162*g* may be similar to, or the same as, those for forming the source/drain structure 142, the isolating feature 136, the silicide layer 160, and the contact 162 described previously and therefore are not repeated herein.

Figure 10:
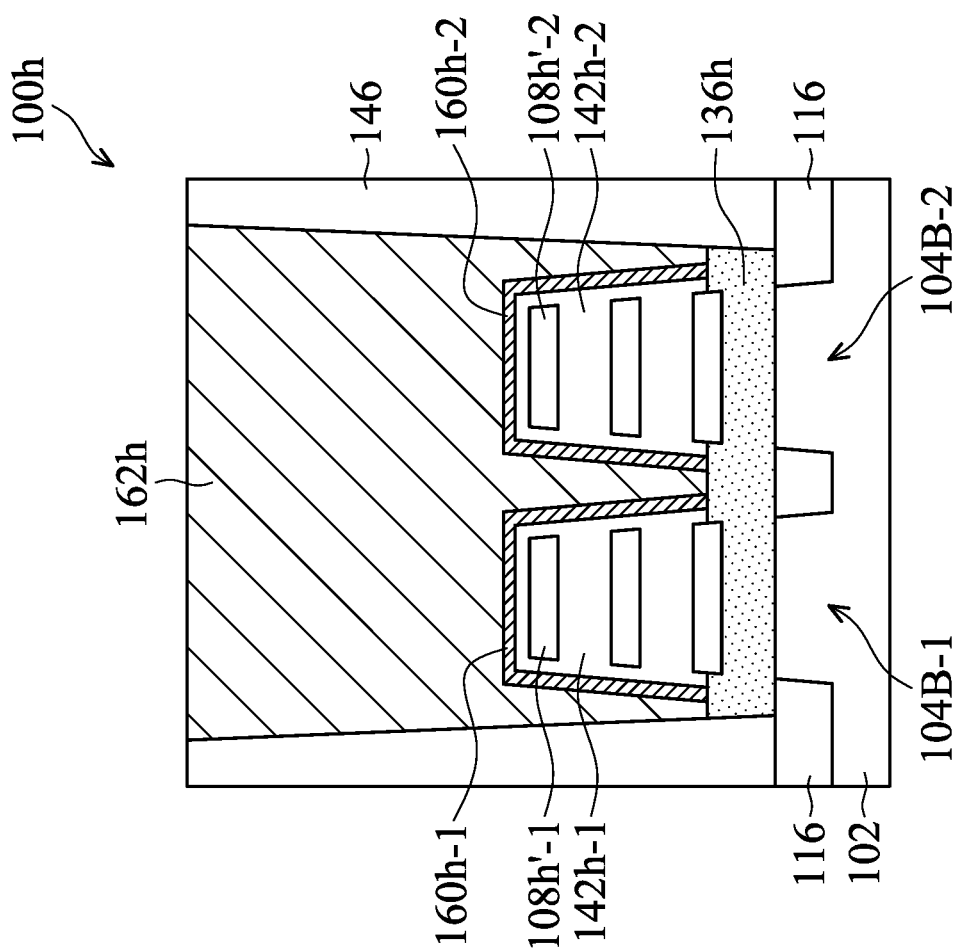
FIG. 10 illustrates a cross-sectional representation of a semiconductor structure in accordance with some embodiments.

FIG. 10 illustrates a cross-sectional representation of a semiconductor structure 100*h* in accordance with some embodiments. The semiconductor structure 100*h* may be the same as the semiconductor structure 100*g* described above, except the source/drain structures at two fin structures are not merged. Processes and materials for forming the semiconductor structure 100*h* similar to, or the same as, those for forming the semiconductor structure 100*g* are not repeated herein.

More specifically, an isolating feature 136*h* is formed at the bottom portion of the source/drain region of the base fin structures 104B-1 and 104B-2 in accordance with some embodiments. Afterwards, source/drain structures 142*h*-1 and 142*h*-2 are formed around the nanostructures 108*h*'-1 and 108*h*'-2 and are separated from each other, as shown in FIG. 10 in accordance with some embodiments. In some embodiments, the bottom surface of the source/drain trench 130*h* is completely covered by the isolating feature 136*h*, and the isolating feature 136*h* is partially covered by the source/drain structures 142*h*-1 and 142*h*-2.

After the source/drain structures 142*h*-1 and 142*h*-2 are formed, processes shown in FIGS. 2G-1 to 2J-1 and 2G-2 to 2J-2 described previously are performed to form the semiconductor structure 100*h*, and silicide layers 160*h*-1 and 160*h*-2 and a contact 162*h* are formed over the source/drain structures 142*h*, as shown in FIG. 10 in accordance with some embodiments. The processes and materials for forming the silicide layers 160*h*-1 and 160*h*-2 and the contact 162*h* may be similar to, or the same as, those for forming the silicide layer 160 and the contact 162 described previously and are not repeated herein.

More specifically, the silicide layer 160h-1 is formed at the top surface and the sidewalls of the source/drain structure 142h-1, and the silicide layer 160h-2 is formed at the top surface and the sidewalls of the source/drain structure 142h-2 in accordance with some embodiments.

In some embodiments, a portion of the contact 162h is interposed between the silicide layers 160h-1 and 160h-2. In some embodiments, the contact 162h is in direct contact with the isolating feature 136h. Generally, source/drain structures are formed on opposite sides of the nanostructure over a substrate. However, as the device size scaled down, an off-state leakage current path may occur at the bottom of the source/drain structures. Accordingly, in the embodiments described above, an additional isolating feature (e.g. the isolating features 136, 136a, 136b', 136c, 136d, 136e, 136f, 136g, and 136h) is formed before forming the source/drain structures (e.g. the source/drain structures 142, 142d, 142e, 142f, 142g 142h-1, and 142h-2), so that the source/drain structures will be separated from the substrate 102 by the isolating feature. Therefore, the current leakage may be avoided and the performance of the semiconductor structures may be improved.

In addition, although the isolating features 136, 136a, 136b', 136c, 136d, 136e, 136f, 136g, and 136h are shown in different figures, they may be formed in the same device. That is, a semiconductor structure may include more than one of the semiconductor structures described above including more than one of the isolating features 136, 136a, 136b', 136c, 136d, 136e, 136f, 136g, and 136h. In some embodiments, a semiconductor structure includes a PMOS transistor having the structure shown in FIGS. 3B-1 and 3B-2 and a NMOS transistor having the structure shown in FIGS. 5B-1 and 5B-2.

It should be noted that same elements in FIGS. 1A to 10 may be designated by the same numerals and may include similar materials and may be formed by similar processes; therefore such redundant details are omitted in the interest of brevity. In addition, although FIGS. 1A to 10 are described in relation to the method, it will be appreciated that the structures disclosed in FIGS. 1A to 10 are not limited to the method but may stand alone as structures independent of the method. Similarly, although the methods shown in FIGS. 1A to 10 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include nanostructure and source/drain structures connected to the nanostructures formed over a substrate. In addition, an isolating feature may be formed before forming the source/drain structures, so that the source/drain structure is separated from the substrate. Accordingly, risk of current leakage from the bottom of the source/drain structure may be reduced, and the performance of the semiconductor structure may be increased.

In some embodiments, a semiconductor structure is provided. The semiconductor structure includes a substrate and a fin structure protruding from the substrate. The semiconductor structure also includes nanostructures formed over the fin structure and a gate structure surrounding the nanostructures. The semiconductor structure also includes a source/drain structure connecting to the nanostructures and an isolating feature sandwiched between the fin structure and the source/drain structure.

In some embodiments, a semiconductor structure is provided. The semiconductor structure includes a substrate and a first fin structure protruding from the substrate. The semiconductor structure also includes first nanostructures formed over the first fin structure and a gate structure wrapping around the first nanostructures at a channel region. The semiconductor structure also includes an isolating feature covering a top surface of the first fin structure at a source/drain region and a first source/drain structure formed over the isolating feature and connected to the first nanostructures.

In some embodiments, a method for manufacturing a semiconductor structure is provided. The method for manufacturing the semiconductor structure includes alternately stacking first semiconductor material layers and second semiconductor material layers over a substrate and patterning the first semiconductor material layers, the second semiconductor material layers, and the substrate to form a fin structure. The method for manufacturing the semiconductor structure also includes removing the first semiconductor material layers to form nanostructures from the second semiconductor material layers in a channel region and forming a gate structure wrapping around the nanostructures. The method for manufacturing the semiconductor structure also includes forming a source/drain recess in a source/drain region of the fin structure and forming an isolating feature in the source/drain recess. The method for manufacturing the semiconductor structure also includes forming a source/drain structure covering the isolating feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a fin structure protruding from the substrate;
   nanostructures formed over the fin structure;

inner spacers vertically sandwiched between the nanostructures;
a gate structure surrounding the nanostructures;
a source/drain structure connected to the nanostructures; and
an isolating feature sandwiched between the fin structure and the source/drain structure,
wherein a portion of the inner spacers is laterally sandwiched between the isolating feature and the gate structure.

2. The semiconductor structure as claimed in claim 1, wherein a top surface of the isolating feature is lower than a bottommost surface of the nanostructures.

3. The semiconductor structure as claimed in claim 1, wherein a top surface of the isolating feature is higher than a bottommost surface of the nanostructures.

4. The semiconductor structure as claimed in claim 1, wherein the isolating feature is made of an undoped semiconductor material.

5. The semiconductor structure as claimed in claim 1, wherein the isolating feature is made of an insulating material.

6. The semiconductor structure as claimed in claim 1, wherein the isolating feature has a curved top surface.

7. The semiconductor structure as claimed in claim 1, wherein the isolating feature comprises a liner in direct contact with the fin structure and an insulating material layer over the liner and in direct contact with the source/drain structure.

8. The semiconductor structure as claimed in claim 1, further comprising:
a gate spacer formed on a sidewall of the gate structure, wherein the gate spacer vertically overlaps the inner spacers.

9. The semiconductor structure as claimed in claim 1, wherein a top surface of the isolating feature is higher than a bottom surface of the inner spacers.

10. A semiconductor structure, comprising:
a substrate;
a first fin structure protruding from the substrate;
first nanostructures formed over the first fin structure;
a gate structure wrapping around the first nanostructures at a channel region;
an isolating feature covering a top surface of the first fin structure at a source/drain region; and
a first source/drain structure formed over the isolating feature and connected to the first nanostructures,
wherein the isolating feature is separated from the first nanostructures by the first source/drain structure.

11. The semiconductor structure as claimed in claim 10, further comprising:
first inner spacers formed between the first nanostructures,
wherein the isolating feature and the gate structure are separated by the first inner spacers.

12. The semiconductor structure as claimed in claim 10, further comprising:
an isolation structure formed around the first fin structure, wherein a bottom surface of the isolating feature is lower than a top surface of the isolation structure.

13. The semiconductor structure as claimed in claim 10, wherein the isolating feature is spaced apart from the gate structure.

14. A method for manufacturing a semiconductor structure, comprising:
alternately stacking first semiconductor material layers and second semiconductor material layers over a substrate;
patterning the first semiconductor material layers, the second semiconductor material layers, and the substrate to form a fin structure;
forming spacers at opposite sides of the fin structure;
forming a source/drain recess in a source/drain region of the fin structure between the spacers;
forming an isolating feature in the source/drain recess between the spacers;
forming a source/drain structure covering the isolating feature;
removing the first semiconductor material layers to form nanostructures from the second semiconductor material layers in a channel region; and
forming a gate structure wrapping around the nanostructures.

15. The method for manufacturing the semiconductor structure as claimed in claim 14, wherein a middle portion of the isolating feature is higher than an edge portion of the isolating feature.

16. The method for manufacturing the semiconductor structure as claimed in claim 14, wherein a middle portion of the isolating feature is lower than an edge portion of the isolating feature.

17. The method for manufacturing the semiconductor structure as claimed in claim 14, further comprising:
removing the first semiconductor material layers and the second semiconductor material layers at the source/drain region to form the source/drain recess,
wherein the isolating feature is formed in a bottom portion of the source/drain recess.

18. The method for manufacturing the semiconductor structure as claimed in claim 14, wherein the isolating feature is made of an undoped Si or undoped SiGe.

19. The method for manufacturing the semiconductor structure as claimed in claim 14, wherein the isolating feature comprises multiple dielectric layers.

20. The method for manufacturing the semiconductor structure as claimed in claim 14, further comprising:
forming an isolation structure around the fin structure,
wherein a top portion of the isolating feature is higher than a top surface of the isolating feature, and a bottom portion of the isolating feature is lower than a bottom surface of the isolation structure.

* * * * *